(12) United States Patent
Okazaki

(10) Patent No.: US 8,421,836 B2
(45) Date of Patent: Apr. 16, 2013

(54) LIGHT-EMITTING DEVICE, PRINT HEAD AND IMAGE FORMING APPARATUS

(75) Inventor: Sachiya Okazaki, Suzuka (JP)

(73) Assignee: Fuji Xerox Co., Ltd., Tokyo (JP)

( * ) Notice: Subject to any disclaimer, the term of this patent is extended or adjusted under 35 U.S.C. 154(b) by 71 days.

(21) Appl. No.: 13/082,056

(22) Filed: Apr. 7, 2011

(65) Prior Publication Data

US 2011/0304681 A1  Dec. 15, 2011

(30) Foreign Application Priority Data

Jun. 14, 2010 (JP) ................. 2010-134681

(51) Int. Cl.
*B41J 2/435* (2006.01)
*B41J 2/47* (2006.01)

(52) U.S. Cl.
USPC .......................... 347/237; 347/247

(58) Field of Classification Search .............. 347/224, 347/225, 237, 238, 247; 257/773, 775, 786
See application file for complete search history.

(56) References Cited

U.S. PATENT DOCUMENTS 7,928,572 B2 * 4/2011 Ogihara et al. ............ 257/758
8,035,116 B2 * 10/2011 Ogihara et al. ............ 257/88

FOREIGN PATENT DOCUMENTS

JP  A-2009-274449  11/2009

* cited by examiner

*Primary Examiner* — Hai C Pham
(74) *Attorney, Agent, or Firm* — Oliff & Berridge, PLC

(57) ABSTRACT

A light-emitting device includes: a circuit board including at least two of signal interconnection layers each having plural signal interconnections, at least adjacent two of the signal interconnection layers including signal interconnections provided so that center positions of the respective signal interconnections in a direction intersecting with a longitudinal direction are displaced from each other in portions of the signal interconnections provided in the longitudinal direction; and plural light-emitting chips each having plural light-emitting elements, the light-emitting chips being arrayed in line in the longitudinal direction on a surface of the circuit board.

8 Claims, 16 Drawing Sheets

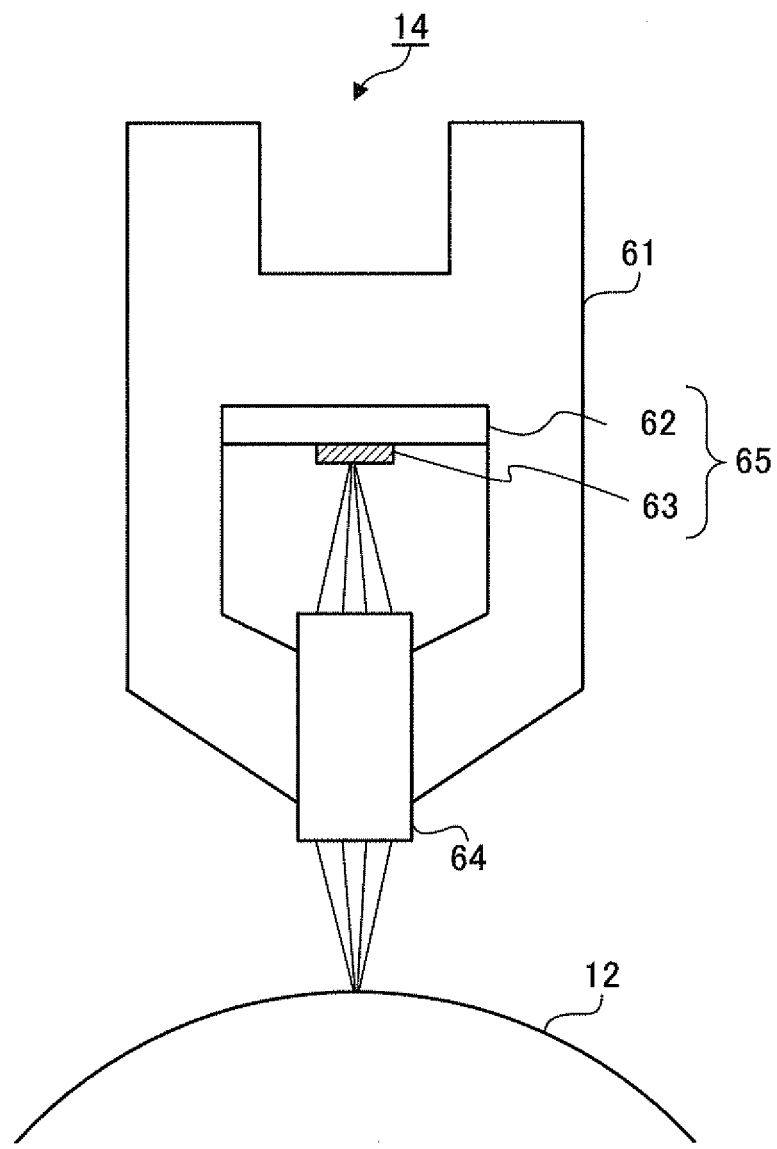

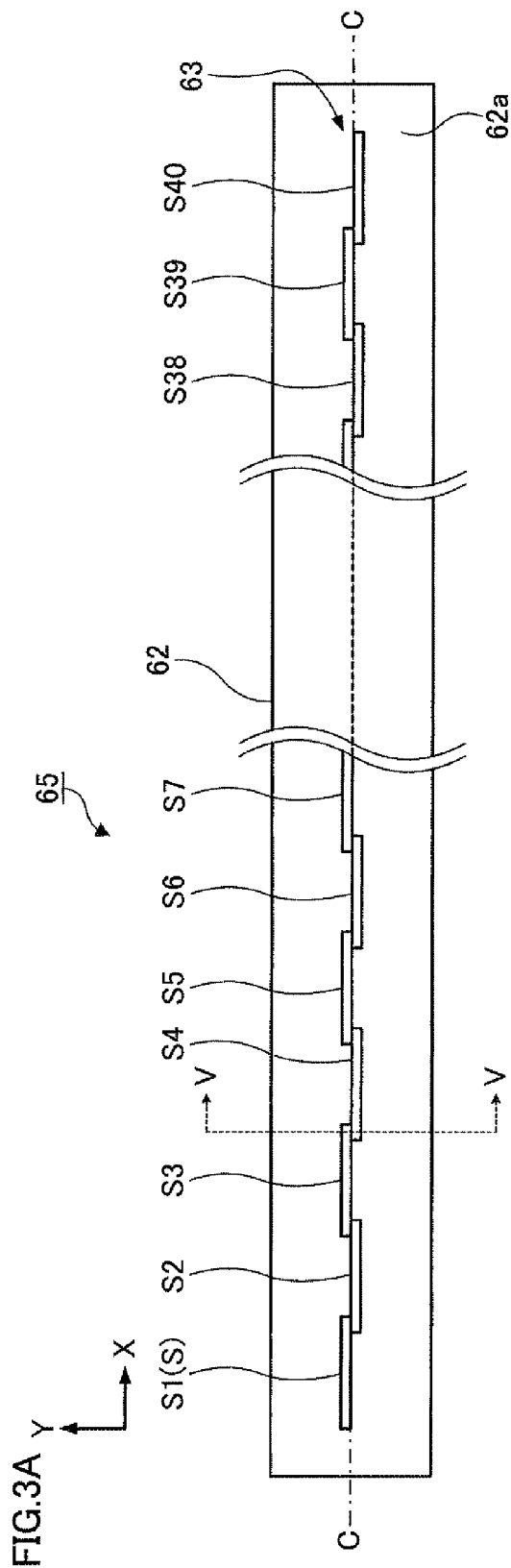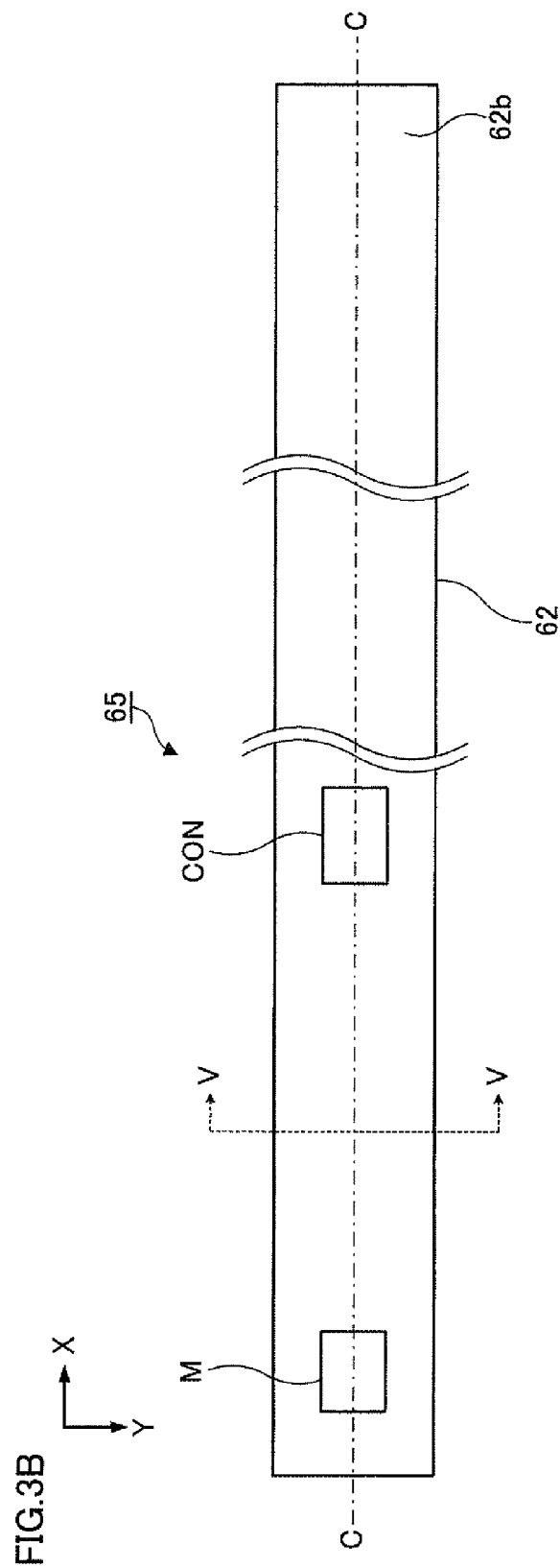

LIGHT-EMITTING DEVICE, PRINT HEAD AND IMAGE FORMING APPARATUS

CROSS REFERENCE TO RELATED APPLICATIONS

This application is based on and claims priority under 35 USC §119 from Japanese Patent Application No. 2010-134681 filed Jun. 14, 2010.

BACKGROUND

1. Technical Field

The present invention relates to a light-emitting device, a print head and an image forming apparatus.

2. Related Art

In an electrophotographic image forming apparatus such as a printer, a copy machine or a facsimile machine, an image is formed on a recording sheet as follows. Firstly, an electrostatic latent image is formed on a uniformly charged photoconductor by causing an optical recording unit to emit light so as to transfer image information onto the photoconductor. Then, the electrostatic latent image is made visible by being developed with toner. Lastly, the toner image is transferred on and fixed to the recording sheet. In addition to an optical-scanning recording unit that performs exposure by laser scanning in the first scanning direction using a laser beam, a recording device using the following LED print head (LPH) has been employed as such an optical recording unit in recent years in response to demand for downsizing the apparatus. This LPH includes a large number of light-emitting diodes (LEDs), serving as light-emitting elements, arrayed in the first scanning direction.

SUMMARY

According to an aspect of the present invention, there is provided a light-emitting device including: a circuit board including at least two of signal interconnection layers each having plural signal interconnections, at least adjacent two of the signal interconnection layers including signal interconnections provided so that center positions of the respective signal interconnections in a direction intersecting with a longitudinal direction are displaced from each other in portions of the signal interconnections provided in the longitudinal direction; and plural light-emitting chips each having plural light-emitting elements, the light-emitting chips being arrayed in line in the longitudinal direction on a surface of the circuit board.

BRIEF DESCRIPTION OF THE DRAWINGS

Exemplary embodiments of the present invention will be described in detail based on the following figures, wherein:

FIG. 2 is a cross-sectional view showing a structure of the print head;

FIGS. 3A and 3B are diagrams for illustrating a planar layout of the light-emitting device;

DETAILED DESCRIPTION

Hereinafter, a description will be given of exemplary embodiments of the present invention in detail with reference to the accompanying drawings.

<First Exemplary Embodiment>

Figure 1:
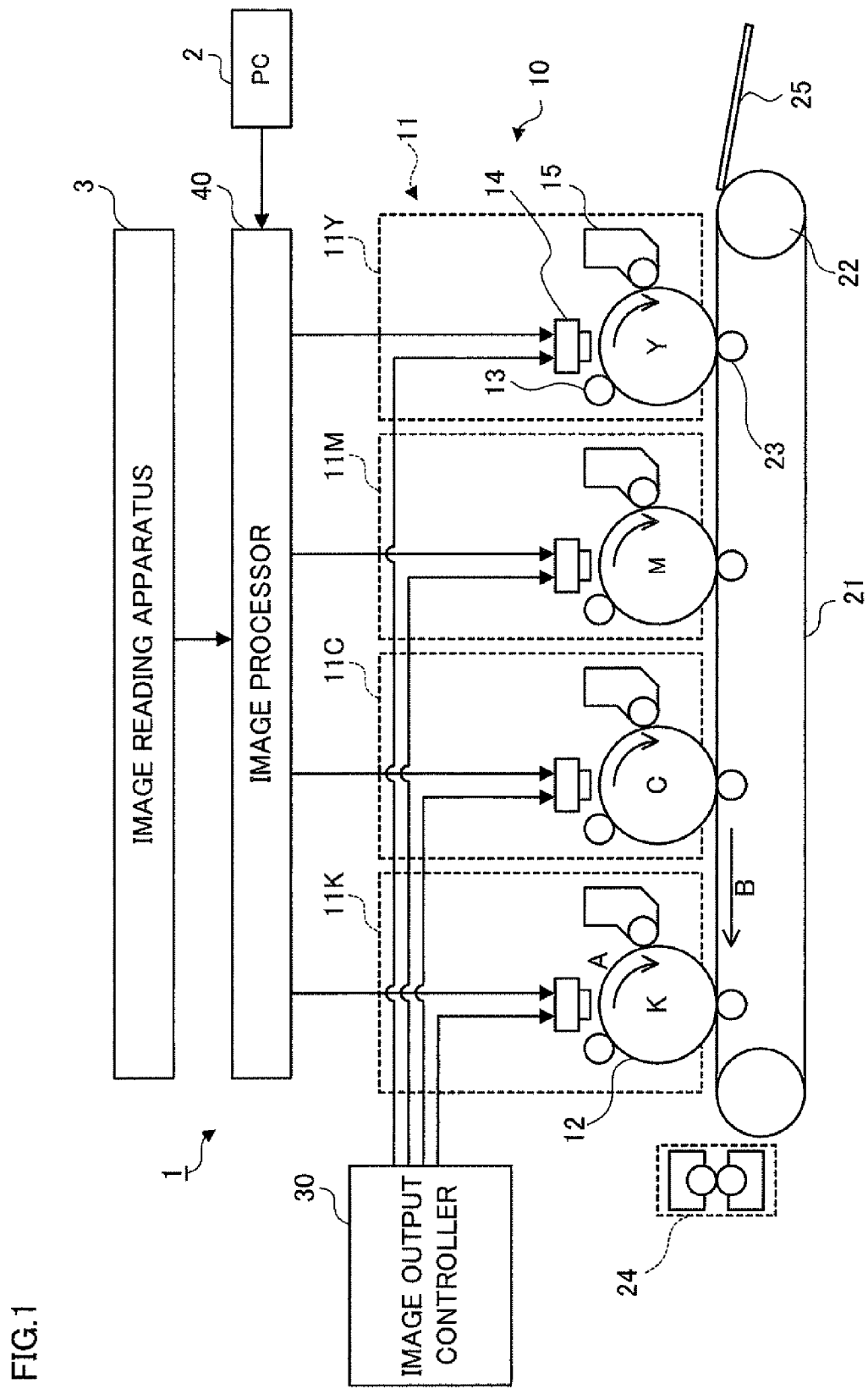
FIG. 1 is a diagram showing an example of an overall configuration of an image forming apparatus to which the first exemplary embodiment is applied.

FIG. 1 is a diagram showing an example of an overall configuration of an image forming apparatus 1 to which the first exemplary embodiment is applied. The image forming apparatus 1 shown in FIG. 1 is what is generally termed as a tandem image forming apparatus. The image forming apparatus 1 includes an image forming process unit 10, an image output controller 30 and an image processor 40. The image forming process unit 10 forms an image in accordance with different color image data. The image output controller 30 controls the image forming process unit 10. The image processor 40, which is connected to devices, such as a personal computer (PC) 2 and an image reading apparatus 3, performs predetermined image processing on image data received from the above devices.

The image forming process unit 10 includes image forming units 11 including plural engines arranged in parallel at predetermined intervals. The image forming units 11 are composed of four image forming units 11Y, 11M, 11C and 11K. Each of the image forming units 11Y, 11M, 11C and 11K includes a photoconductive drum 12, a charging device 13, a print head 14 and a developing device 15. On the photoconductive drum 12, as an example of an image carrier, an electrostatic latent image is formed, and the photoconductive drum 12 retains a toner image. The charging device 13, as an example of a charging unit, charges the surface of the photoconductive drum 12 at a predetermined potential. The print head 14 exposes the photoconductive drum 12 charged by the charging device 13. The developing device 15, as an example of a developing unit, develops an electrostatic latent image formed by the print head 14. The image forming units 11Y, 11M, 11C and 11K form yellow (Y), magenta (M), cyan (C) and black (K) toner images, respectively.

Additionally, the image forming process unit 10 includes a sheet transport belt 21, a drive roll 22, transfer rolls 23 and a fixing device 24. The sheet transport belt 21 transports a recording sheet 25, as an example of a transferred body, so that color toner images respectively formed on the photoconductive drums 12 of the image forming units 11Y, 11M, 11C and 11K are transferred on the recording sheet 25 by multilayer transfer. The drive roll 22 is a roll to drive the sheet transport belt 21. Each transfer roll 23, as an example of a transfer unit, transfers a toner image formed on the corresponding photoconductive drum 12 onto the recording sheet 25. The fixing device 24 fixes the toner images on the recording sheet 25.

In this image forming apparatus 1, the image forming process unit 10 performs an image forming operation on the basis of various kinds of control signals supplied from the image output controller 30. Under the control by the image output controller 30, the image data received from the personal computer (PC) 2 or the image reading apparatus 3 is subjected to image processing by the image processor 40, and then the resultant data is supplied to the corresponding image forming unit 11. Then, for example in the black (K) color image forming unit 11K, the photoconductive drum 12 is charged at a predetermined potential by the charging device 13 while rotating in an arrow A direction, and then is exposed by the print head 14 emitting light on the basis of the image data supplied from the image processor 40. By this operation, an electrostatic latent image for a black (K) color image is formed on the photoconductive drum 12. Thereafter, the electrostatic latent image formed on the photoconductive drum 12 is developed by the developing device 15, and accordingly the black (K) color toner image is formed on the photoconductive drum 12. Yellow (Y), magenta (M) and cyan (C) color toner images are formed in the image forming units 11Y, 11M and 11C, respectively.

The color toner images on the respective photoconductive drums 12, which are formed in the respective image forming units 11, are electrostatically transferred to the recording sheet 25 supplied with the movement of the sheet transport belt 21 by a transfer electric field applied to the transfer rolls 23, in sequence. Here, the sheet transport belt 21 moves in an arrow B direction. By this operation, a synthetic toner image on which color toners are superimposed is formed on the recording sheet 25.

Thereafter, the recording sheet 25 on which the synthetic toner image is electrostatically transferred is transported to the fixing device 24. The synthetic toner image on the recording sheet 25 transported to the fixing device 24 is fixed on the recording sheet 25 through fixing processing using heat and pressure by the fixing device 24, and then is outputted from the image forming apparatus 1.

FIG. 2 is a cross-sectional view showing a structure of the print head 14. The print head 14 includes: a housing 61; a light-emitting device 65, as an example of an exposure unit, including a light-emitting portion 63 with plural light-emitting elements exposing the photoconductive drum 12; and a rod lens array 64, as an example of an optical unit, causing light emitted by the light-emitting portion 63 to form an image on the surface of the photoconductive drum 12.

The light-emitting device 65 also includes a circuit board 62 mounted with the light-emitting portion 63, a signal generating circuit M (see FIG. 3B to be described later) generating signals for driving the light-emitting portion 63, and the like.

The housing 61 is made of metal, for example, and supports the circuit board 62 and the rod lens array 64. The housing 61 is set so that images of the light-emitting points of the light-emitting elements in the light-emitting portion 63 are formed on the focal plane of the rod lens array 64. In addition, the rod lens array 64 is arranged in an axial direction of the photoconductive drum 12 (the first scanning direction).

FIGS. 3A and 3B are diagrams for illustrating a planar layout of the light-emitting device 65. FIG. 3A shows the front surface of the light-emitting device 65, while FIG. 3B shows the rear surface of the light-emitting device 65.

As shown in FIG. 3A, the circuit board 62 is elongated in the X direction, which is the first scanning direction. The light-emitting portion 63 is formed on a front surface 62a that is one of the surfaces of the circuit board 62. The light-emitting portion 63 is formed of forty light-emitting chips S1 to S40, for example, arrayed one-dimensionally in the X direction (the first scanning direction), which is the longitudinal direction of the circuit board 62. The light-emitting chips S1 to S40 each have a surface shaped into an elongated rectangle, and are arranged in two lines in a staggered manner so that a part of the longitudinal edges thereof face each other with the center line of the circuit board 62 in the Y direction interposed therebetween. Here, the center line is indicated by the C-C line and is the second scanning direction. Each of the light-emitting chips S has a surface having a length of 1 mm and a width of 150 µm, for example.

In the following description, the light-emitting chips S1 to S40, when not individually distinguished, will be referred to as light-emitting chips S.

Note that the Y direction (the second scanning direction), which is the lateral direction, is a direction intersecting with the X direction (the first scanning direction), which is the longitudinal direction of the circuit board 62. The X direction (the first scanning direction) is the axial direction of the photoconductive drum 12, while the Y direction (the second scanning direction) is the rotational direction of the photoconductive drum 12.

On the other hand, as shown in FIG. 3H, a rear surface 62b that is the other surface of the circuit board 62 includes: the signal generating circuit M that is configured by an integrated circuit and the like and transmits signals to drive the light-emitting portion 63; and a connector CON for connecting interconnections to supply control signals from the image output controller 30 and image data from the image processor 40 to the light-emitting device 65. The signal generating circuit M and the connector CON are also arranged on the center line (the C-C line) in the lateral direction of the circuit board 62 on the rear surface 62b of the circuit board 62.

Since FIGS. 3A and 3B show sides opposite to each other, the Y direction of FIG. 3A is reversed from that of FIG. 3B.

Note that the front surface 62a and the rear surface 62b of the circuit board 62 may be mounted with other electrical components, such as a capacitor and a resistor, as well as those described above.

Figure 4:
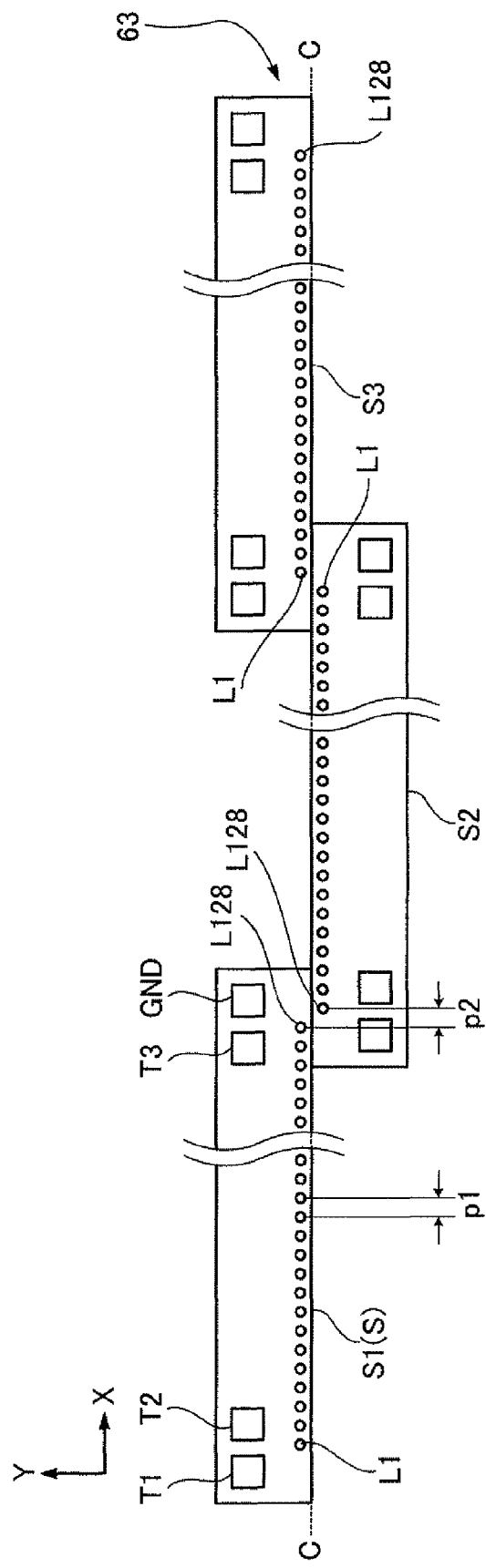
FIG. 4 is a diagram for illustrating the light-emitting portion in detail.

FIG. 4 is a diagram for illustrating the light-emitting portion 63 in detail. Here, a portion of the light-emitting chips S1 to S3 is shown.

Each of the light-emitting chips S is provided with 128 light-emitting elements L1 to L128, for example, on the surface of the light-emitting chip S along the longitudinal edge thereof. The light-emitting elements L1 to L128, when not individually distinguished, will be referred to as light-emitting elements L.

Each of the light-emitting chips S also includes: a T1 terminal, a T2 terminal and a T3 terminal supplied with signals from the signal generating circuit M; and a GND terminal supplied with a ground (GND) potential. Each of the light-emitting chips S is supplied with a power supply (Vcc) potential from the rear surface.

In the light-emitting portion 63, every second light-emitting chip S is rotated by 180 degrees and the light-emitting chips S are arrayed in a staggered manner so that the longitudinal edges of the respective light-emitting chips S on the sides where the light-emitting elements L are provided face each other. Here, the positions of two adjacent light-emitting chips S (for example, the light-emitting chips S1 and S2) are set so that a distance p2 in the X direction between light-emitting points of the light-emitting elements L of two adjacent light-emitting chips S, for example, a distance p2 between the light-emitting point of the light-emitting element L128 of the light-emitting chip S1 and that of the light-emitting element L128 of the light-emitting chip S2, is equal to a pitch p1 of the light-emitting elements L in the light-emitting chip S1.

Note that the light-emitting chips S1 to S40 may be arrayed not in a staggered manner but in a straight line.

In this description, as an example, the light-emitting chip S is assumed to include the T1 terminal, the T2 terminal, the T3 terminal and the GND terminal to which signals are transmitted; however, the configuration of terminals is not limited to a particular one as long as the configuration allows for supply of signals required for light-up control of the light-emitting elements L of the light-emitting chips S. Bonding pads 304b (see FIG. 5 to be described later) may be provided corresponding to the configuration of terminals.

Figure 5:
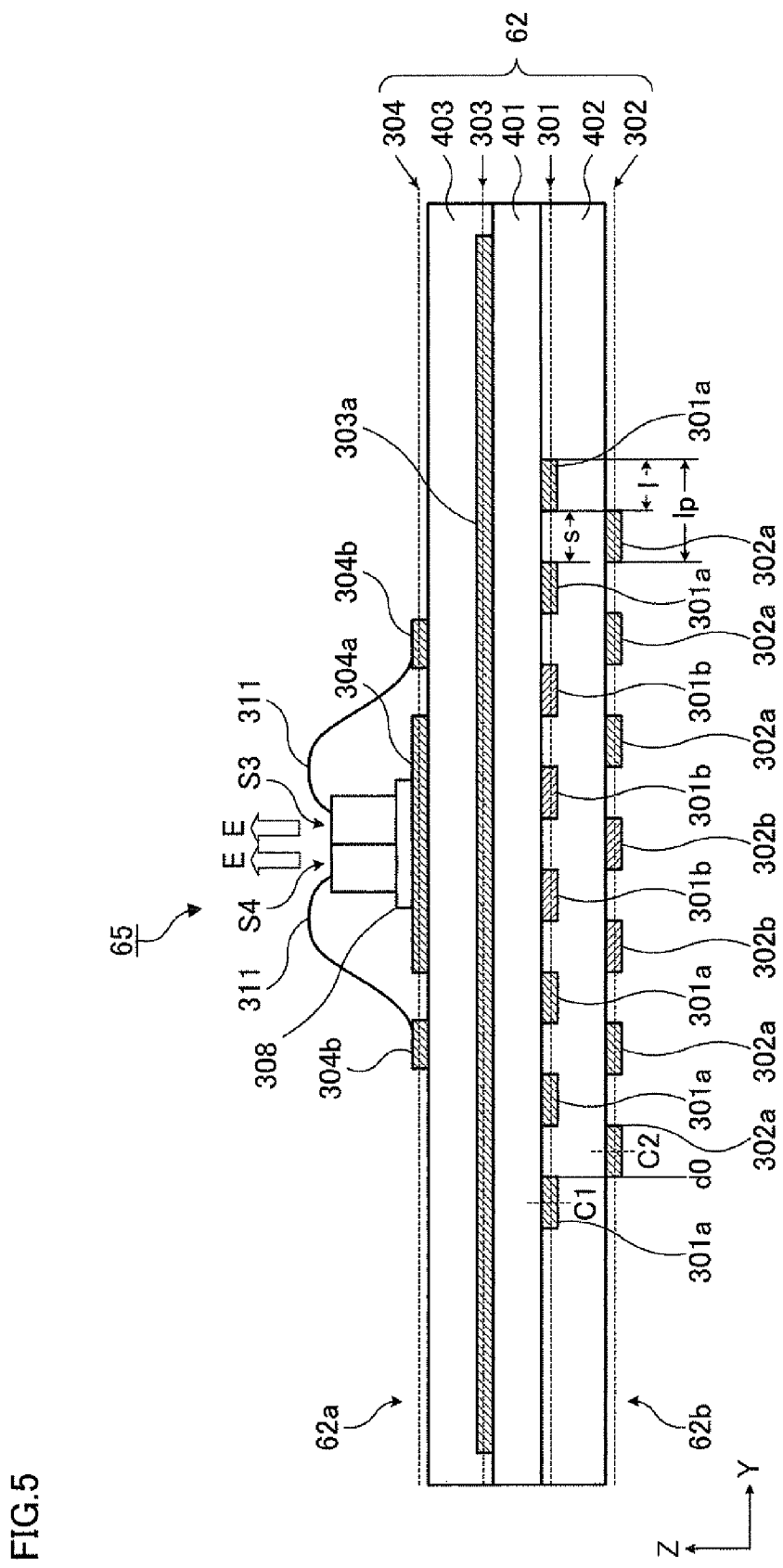
FIG. 5 is a diagram for illustrating a cross-sectional structure of the light-emitting device to which the first exemplary embodiment is applied.

FIG. 5 is a diagram for illustrating a cross-sectional structure of the light-emitting device 65. FIG. 5 shows the cross-sectional structure taken along the line V-V shown in FIGS. 3A and 38. The V-V line is set at a portion where the longitudinal edges of the light-emitting chips S3 and S4 face with each other. Thus, FIG. 5 shows the cross section of the circuit board 62 at a portion where the light-emitting chips S3 and S4 are provided.

Here, the right direction in the figure is the Y direction, and the upper direction in the figure, namely, the thickness direction of the circuit board 62 (the direction from the rear surface 62b toward the front surface 62a of the circuit board 62) is the Z direction. The light-emitting chips S3 and S4 are mounted side by side on the front surface 62a of the circuit board 62.

The configuration of the circuit board 62 is described with reference to FIG. 5.

The circuit board 62 includes a first insulating layer 401 composed of an electrically insulating material at the center in the thickness direction (Z). The circuit board 62 also includes a first signal interconnection layer 301, as an example of signal interconnection layers, that is in contact with the first insulating layer 401, is composed of a conductive material and includes signal interconnections 301a and pseudo interconnections 301b, on the lower side of the first insulating layer 401 (referring to the lower side in the figure). The circuit board 62 further includes a second insulating layer 402 that is in contact with the first signal interconnection layer 301 and is composed of an electrically insulating material, on the lower side of the first signal interconnection layer 301. The circuit board 62 further includes a second signal interconnection layer 302, as an example of signal interconnection layers, that is in contact with the second insulating layer 402, is composed of a conductive material and includes signal interconnections 302a and pseudo interconnections 302b, on the lower side of the second insulating layer 402.

In the following description, the signal interconnections 301a and 302a, when not individually distinguished, will be referred to as signal interconnections, and the pseudo interconnections 301b and 302b, when not individually distinguished, will be referred to as pseudo interconnections.

A layer including signal interconnections and pseudo interconnections composed of a layer of one conductive material, such as the first signal interconnection layer 301 including the signal interconnections 301a and the pseudo interconnections 301b is herein referred to as signal interconnection layer.

The signal interconnections (the signal interconnections 301a and 302a) are those which transmit various electrical signals to the light-emitting chips S. The signals are transmitted from the signal generating circuit M or the connector CON through the signal interconnections 301a and 302a to the T1 terminals, the T2 terminals and the T3 terminals provided to the respective light-emitting chips S.

In contrast, the pseudo interconnections (the pseudo interconnections 301b and 302b) are not intended to transmit electrical signals, but additionally provided among the signal interconnections 301a and 302a. The potential of the pseudo interconnections 301b and 302b may be fixed to the GND potential.

On the other hand, the circuit board 62 includes a first conductive layer 303 that is in contact with the first insulating layer 401 and is composed of a conductive material, on the upper side of the first insulating layer 401 (referring to the upper side in the figure). The circuit board 62 further includes a third insulating layer 403 that is in contact with the first conductive layer 303 and is composed of an electrically insulating material, on the upper side of the first conductive layer 303. The circuit board 62 further includes a second conductive layer 304 that is in contact with the third insulating layer 403 and is composed of a conductive material, on the upper side of the third insulating layer 403.

Here, the first conductive layer 303, for example, includes a power interconnection 303a supplying the GND potential.

The second conductive layer 304 includes: a power interconnection 304a supplying the Vcc potential in common to the light-emitting chips S1 to S40; and the bonding pads 304b connected through bonding wires 311 to the T1 terminals, the T2 terminals, the T3 terminals and the GND terminals provided to the respective light-emitting chips S1 to S40.

As shown in FIG. 5, the rear surfaces of the light-emitting chips S1 to S40 (FIG. 5 shows the light-emitting chips S3 and S4.) are fixed on the power interconnection 304a with adhesive 308 having electrical conductivity. The light-emitting chips S3 and S4 are supplied with the Vcc potential through the rear surfaces thereof.

On the other hand, the GND terminals of the light-emitting chips S3 and S4 are connected through the respective bonding wires 311 to the bonding pads 304b set to the GND potential, and supplied with the GND potential.

The T1 terminals, the T2 terminals and the T3 terminals of the light-emitting chips S3 and S4 are connected through the respective bonding wires 311 to the respectively allocated bonding pads 304b, and supplied with signals.

The direction E of light emission (the direction indicated with an arrow E) from the light-emitting elements L of the light-emitting chips S is perpendicular to the surfaces of the light-emitting chips S.

The signal generating circuit M mounted on the circuit board 62 of the light-emitting device 65 is supplied with image data subjected to image processing and various kinds of control signals from the image output controller 30 and the image processor 40 (see FIG. 1). Then, the signal generating circuit M performs rearrangement of the image data, correction of intensity of light emission, and the like, on the basis of the image data and the various kinds of control signals.

The signal generating circuit M transmits signals to control light-up of the light-emitting elements L to the respective light-emitting chip S (S1 to S40).

Conventionally known light-emitting diodes, light-emitting thyristors or the like may be used for the light-emitting elements of the light-emitting chips S. In addition, organic electroluminescent devices or inorganic electroluminescent devices may be used for the light-emitting elements of the light-emitting chips S. Thus, a description of the light-emitting elements of the light-emitting chips S is omitted.

Next, the first signal interconnection layer 301 and the second signal interconnection layer 302 are described in more detail.

As shown in FIGS. 3A and 3B, the light-emitting device 65 is configured with the plural light-emitting chips S1 to S40 arranged in line. In order that signals are transmitted from the signal generating circuit M or the connector CON to the light-emitting chips S1 to S40 arranged in line, some of the signal interconnections 301a and 302a are provided in the X direction, which is the longitudinal direction of the circuit board 62. Thus, FIG. 5 shows the cross sections of portions of the signal interconnections 301a and 302a provided along the longitudinal direction of the circuit board 62, the cross sections being taken in the direction intersecting with the longitudinal direction of the circuit board 62, namely, in the Y direction (the width direction) herein, which is the lateral direction thereof. The pseudo interconnections 301b and 302b provided among the signal interconnections 301a and 302a are also provided in the X direction, which is the longitudinal direction of the circuit board 62. Accordingly, FIG. 5 also shows the cross sections of portions of the pseudo interconnections 301b and 302b provided along the longitudinal direction of the circuit board 62, the cross sections being taken in the direction intersecting with the longitudinal direction of the circuit board 62, namely, in the Y direction (the width direction) herein, which is the lateral direction thereof.

The signal interconnections 301a and the pseudo interconnections 301b herein are provided with an interconnection pitch 1p. The signal interconnections 302a and the pseudo interconnections 302b are provided with the interconnection pitch 1p.

Additionally, these interconnections are displaced from each other so that the positions of the centers C1 (the center positions C1) in the width direction of the signal interconnections 301a and the pseudo interconnections 301b and those of the centers C2 (the center positions C2) in the width direction of the signal interconnections 302a and the pseudo interconnections 302b do not overlap in the direction intersecting with the longitudinal direction of the circuit board 62, for example, in the Y direction, which is the lateral direction thereof.

For example, assume that the interconnection pitch 1p is 200 μm and an interconnection width 1 of the signal interconnections 301a, the pseudo interconnections 301b, the signal interconnections 302a and the pseudo interconnections 302b is 100 μm. That is, the interconnection (line) width 1 and a space width s are both 100 μm, and have a ratio of 1:1.

Then, if the distance between the center positions C1 of the signal interconnections 301a and the pseudo interconnections 301b and the center positions C2 of the signal interconnections 302a and the pseudo interconnections 302b is 100 μm, the signal interconnections 301a and the pseudo interconnections 301b are placed between the signal interconnections 302a and the pseudo interconnections 302b in the Y direction, as shown in FIG. 5. That is, the distance d0 between the edges of the signal interconnections 301a or the pseudo interconnections 301b and those of the signal interconnections 302a or the pseudo interconnections 302b is 0.

Next, the first signal interconnection layer 301, the second signal interconnection layer 302, the first conductive layer 303 and the second conductive layer 304 that form the circuit board 62 are individually described.

Figure 6:
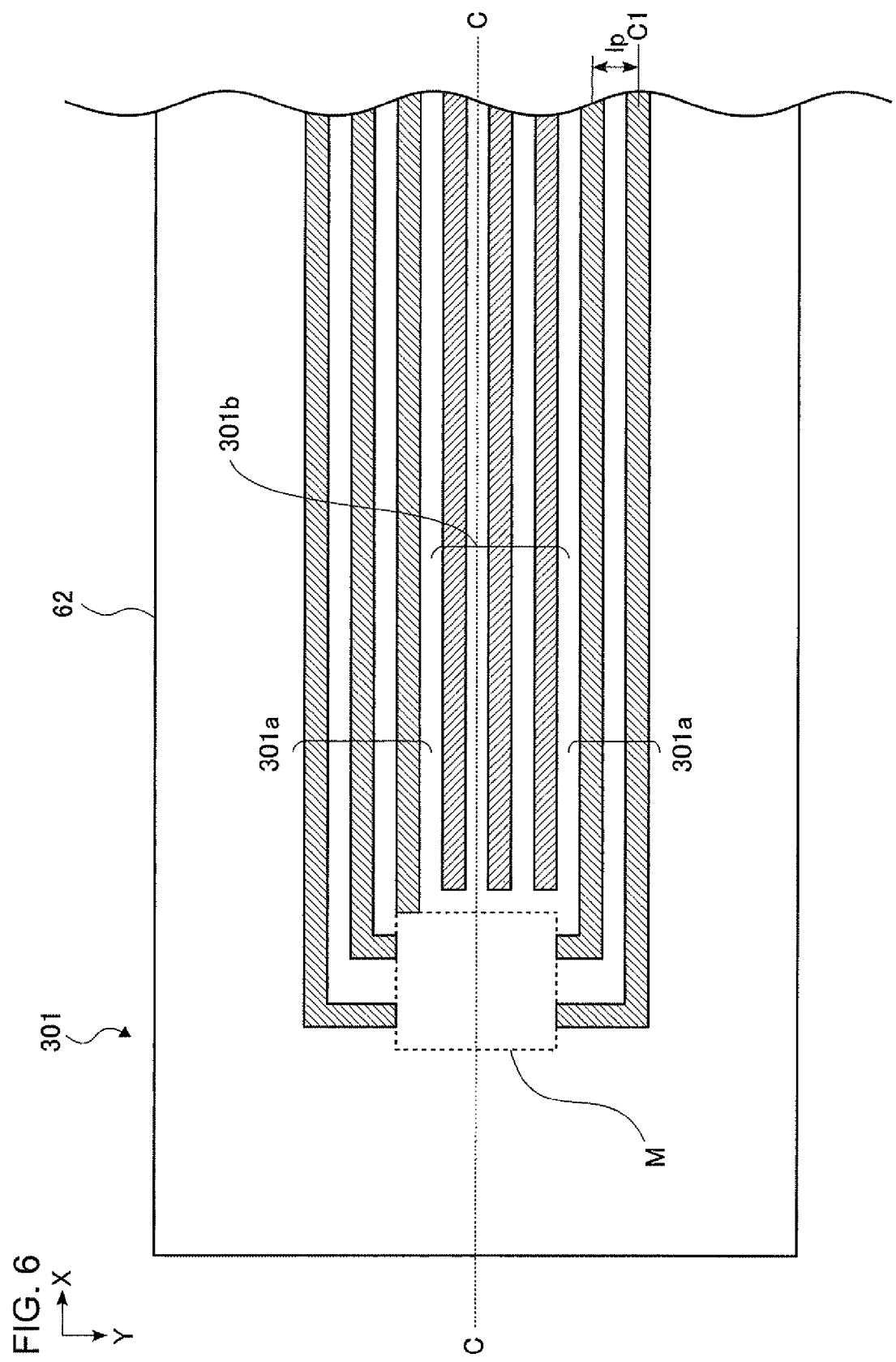
FIG. 6 is a plan view illustrating the first signal interconnection layer.

FIG. 6 is a plan view illustrating the first signal interconnection layer 301. FIG. 6 is a view of the circuit board 62 seen from the rear surface (the lower side in FIG. 5).

The signal interconnections 301a and the pseudo interconnections 301b are provided in the X direction, which is the longitudinal direction of the circuit board 62. Some of the signal interconnections 301a respectively have portions provided along the Y direction, which is the lateral direction of the circuit board 62, so as to be connected to the signal generating circuit M provided on the second signal interconnection layer 302. On the other hand, the pseudo interconnections 301b are not connected to the signal generating circuit M.

The signal interconnections 301a and the pseudo interconnections 301b are provided with the interconnection pitch 1p.

Figure 7:
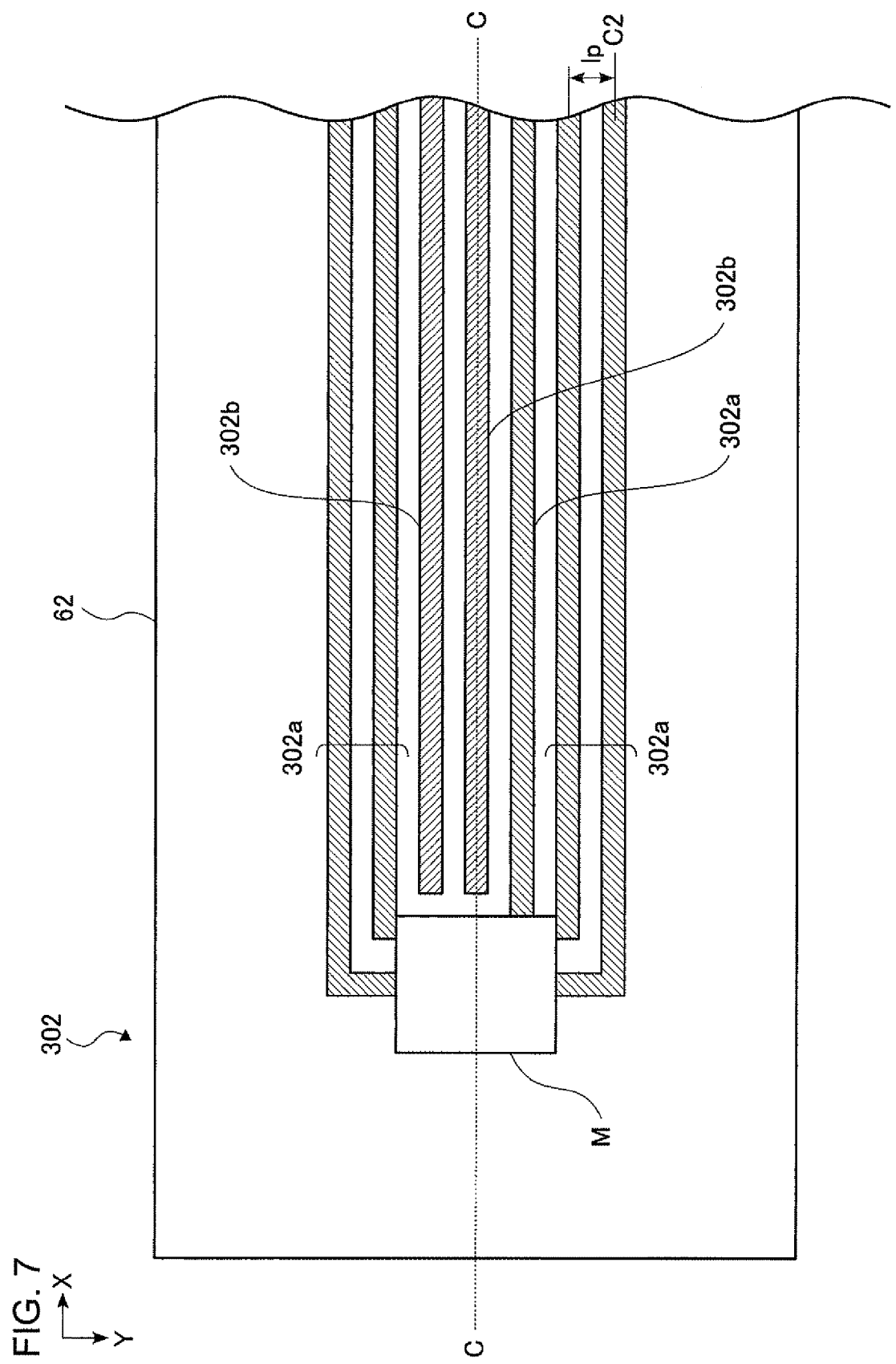
FIG. 7 is a plan view illustrating the second signal interconnection layer.

FIG. 7 is a plan view illustrating the second signal interconnection layer 302. FIG. 7 is a view of the circuit board 62 seen from the rear surface (the lower side in FIG. 5).

The signal interconnections 302a and the pseudo interconnections 302b are provided in the X direction, which is the longitudinal direction of the circuit board 62. Some of the signal interconnections 302a respectively have portions provided along the Y direction, which is the lateral direction of the circuit board 62, so as to be connected to the signal generating circuit M. On the other hand, the pseudo interconnections 302b are not connected to the signal generating circuit M.

Portions of the signal interconnections 302a and the pseudo interconnections 302b provided along the X direction, which is the longitudinal direction of the circuit board 62, are provided with the interconnection pitch 1p. These portions of the interconnections are displaced from each other so that the center positions C2 thereof in the Y direction (the width direction), which is the lateral direction of the circuit board 62, do not overlap the center positions C1 (see FIGS. 5 and 6) in the Y direction (the width direction) of those portions of the signal interconnections 301a and the pseudo interconnections 301b of the first signal interconnection layer 301 which are provided along the X direction of the circuit board 62.

Figure 8:
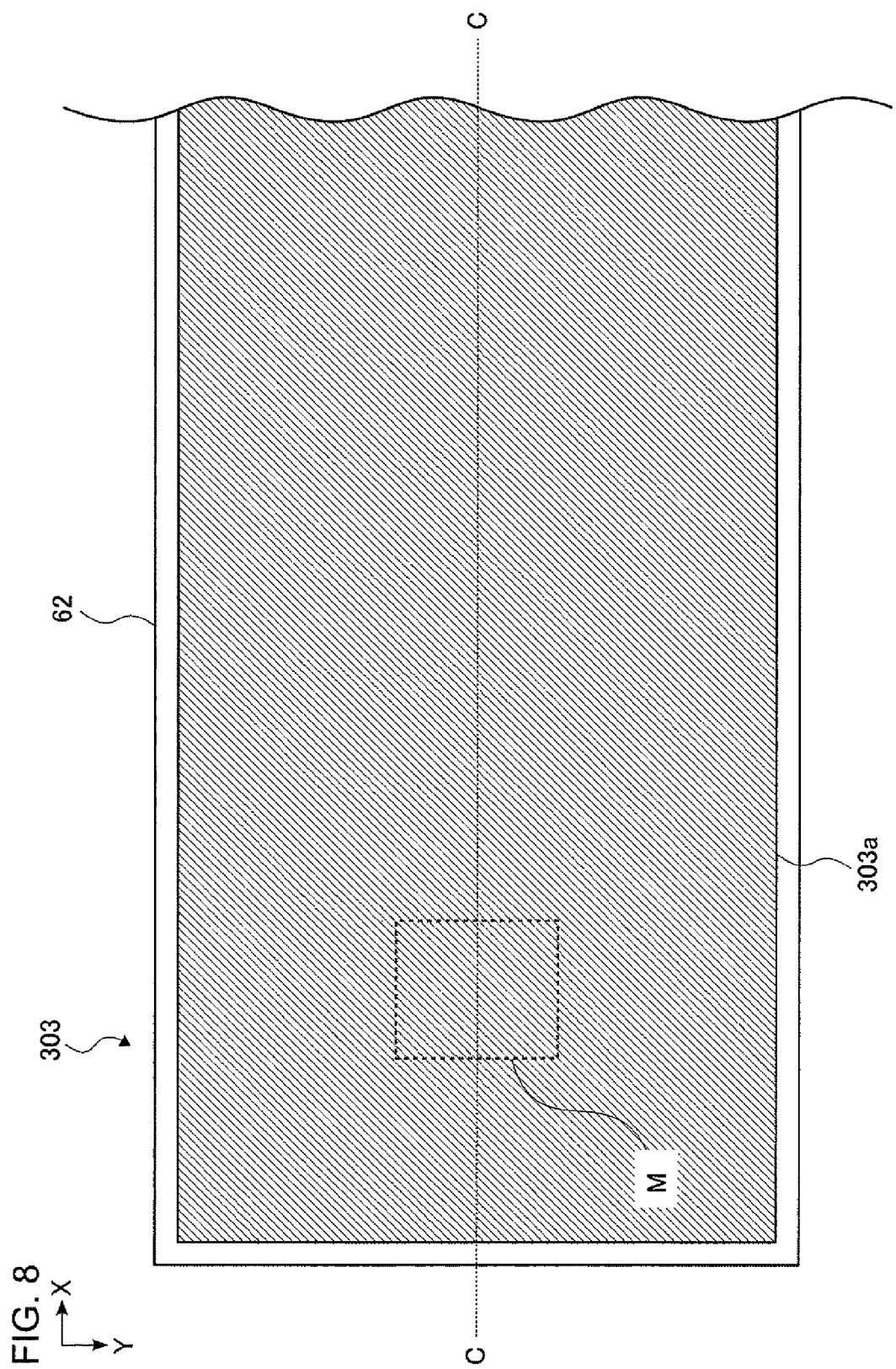
FIG. 8 is a plan view illustrating the first conductive layer.

FIG. 8 is a plan view illustrating the first conductive layer 303. FIG. 8 is a view of the circuit board 62 seen from the rear surface (the lower side in FIG. 5).

The first conductive layer 303 is provided with the power interconnection 303a set to the GND potential. The power interconnection 303a is provided so as to solidly fill the whole surface of the circuit board 62 except for a region defined at the periphery of the circuit board 62 where any interconnection is prohibited. With this configuration, variation of the potential level of control signals transmitted to the signal interconnections 301a and 302a is reduced by use of the GND potential, and thereby malfunction of the light-emitting device 65 is suppressed.

Figure 9:
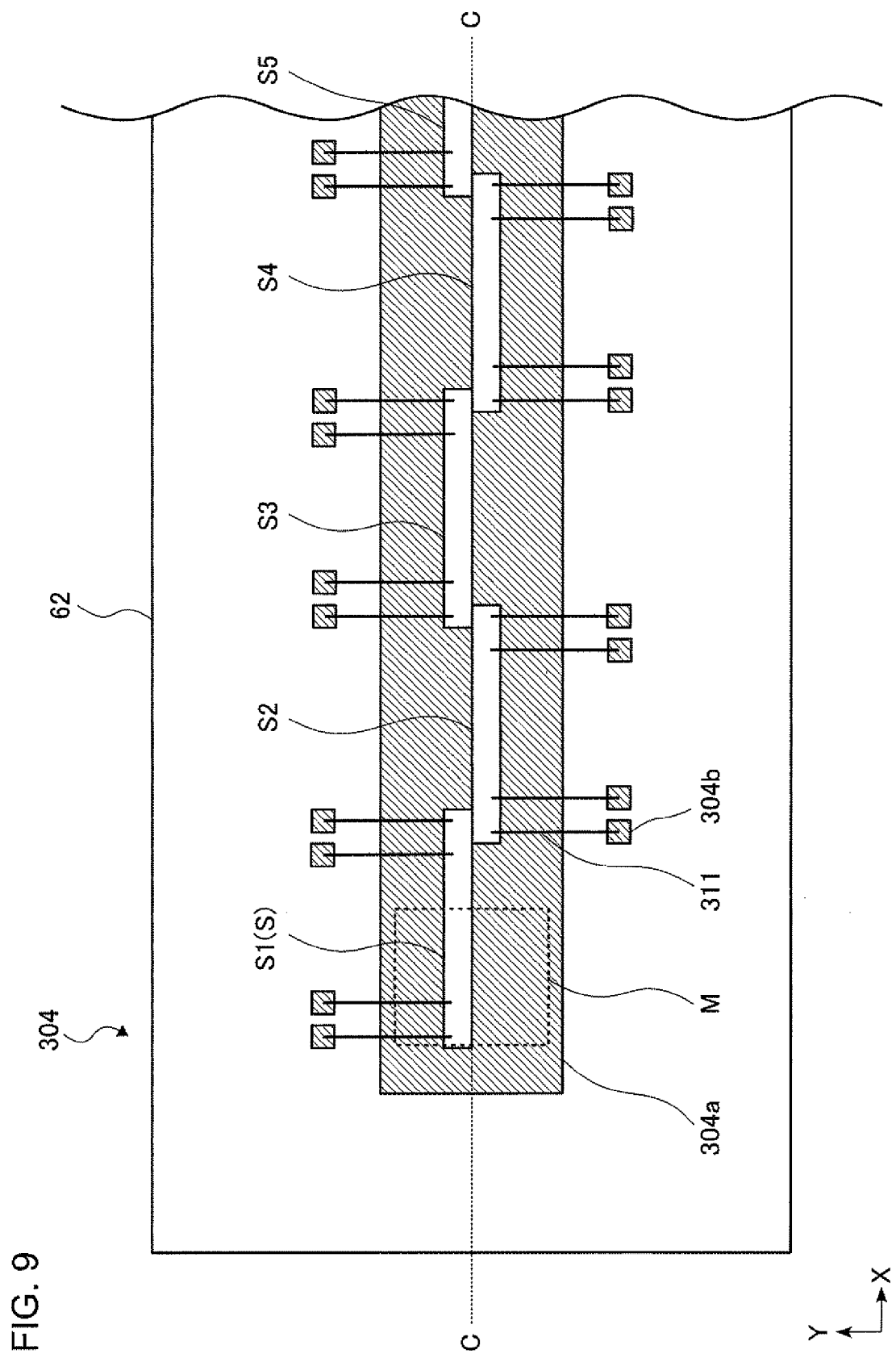
FIG. 9 is a plan view illustrating the second conductive layer.

FIG. 9 is a plan view illustrating the second conductive layer 304. FIG. 9 is a view of the circuit board 62 seen from the front surface (the upper side in FIG. 5). FIG. 9 also shows the light-emitting chips S1 to S5 and the bonding wires 311.

The second conductive layer 304 is provided with the power interconnection 304a supplying the Vcc potential and the bonding pads 304b.

The power interconnection 304a is provided as a solid fill so as to be connected to the bottoms of the light-emitting chips S1 to S40. That is, the rear surfaces of light-emitting chips S1 to S40 are stuck on the power interconnection 304a.

The light-emitting chips S1 to S40 are supplied with the Vcc potential through the rear surfaces thereof. Note that the Vcc potential may be supplied via the bonding wires 311 through terminals provided on the front surfaces of the light-emitting chips S1 to S40.

The width of the power interconnection 304a in the Y direction only needs to be enough for the light-emitting chips S1 to S40 to be arrayed in a staggered manner. The length of the power interconnection 304a in the X direction only needs to be enough for the light-emitting chips S1 to S40 to be arrayed.

Next, a manufacturing method of the circuit board 62 is described.

For example, copper foils are stuck on both of the surfaces of the first insulating layer 401 composed of glass epoxy substrate. The copper foil on one of the surfaces is regarded as the first signal interconnection layer 301, and processed into the signal interconnections 301a and the pseudo interconnections 301b. The copper foil on the other surface is regarded as the first conductive layer 303, and processed into the power interconnection 303a.

Vias connecting the signal interconnections 301a of the first signal interconnection layer 301 to the bonding pads 304b of the second conductive layer 304 may be provided in some cases. Vias connecting the signal interconnections 302a of the second signal interconnection layer 302 to the bonding pads 304b of the second conductive layer 304 may also be provided in some cases. Additionally, vias may be provided in order for signal interconnections to make a detour for the purpose of transmitting signals.

In these vias, openings (through holes) penetrating the first signal interconnection layer 301, the first insulating layer 401 and the first conductive layer 303 are provided by laser processing or photo lithography, and conductors are formed so as to fill the openings or the peripheries of the openings. In this event, the first conductive layer 303 around the openings is removed so that the signal interconnections 301a are not connected to the power interconnection 303a.

Next, prepreg that has one surface provided with a copper foil and is obtained by impregnating glass fibers with semi-cured thermosetting resin (for example, epoxy) is layered on the first signal interconnection layer 301 side. The prepreg is then placed into an autoclave to apply pressure and heat, thereby to cure the semi-cured thermosetting resin. The semi-cured thermosetting resin is cured to give the second insulating layer 402, while the copper foil gives the second signal interconnection layer 302.

Next, prepreg that has one surface provided with a copper foil and is obtained by impregnating glass fibers with semi-cured thermosetting resin (epoxy) is layered on the first conductive layer 303 side. The prepreg is then placed into an autoclave to apply pressure and heat, thereby to cure the semi-cured thermosetting resin. The semi-cured thermosetting resin is cured to give the third insulating layer 403, while the copper foil gives the second conductive layer 304.

After that, the second signal interconnection layer 302 is processed into the signal interconnections 302a and the pseudo interconnections 302b, while the second conductive layer 304 is processed into the power interconnection 304a and the bonding pads 304b.

Vias connecting the signal interconnections 302a of the second signal interconnection layer 302 to the signal interconnections 301a of the first signal interconnection layer 301 and vias connecting the signal interconnections 302a of the second signal interconnection layer 302 to the bonding pads 304b of the second conductive layer 304 may be provided to the second insulating layer 402.

Additionally, vias connecting the signal interconnections 301a of the first signal interconnection layer 301 to the bonding pads 304b of the second conductive layer 304 and vias connecting the power interconnection 303a of the first conductive layer 303 to the bonding pads 304b of the second conductive layer 304 may be provided to the third insulating layer 403.

As described above, in the vias provided to the second insulating layer 402, openings may be provided into the second signal interconnection layer 302 and the second insulating layer 402 by laser processing or photo lithography, and conductors may be formed so as to fill the openings or the peripheries of the openings.

In the vias provided to the third insulating layer 403, openings may be provided into the second conductive layer 304 and the third insulating layer 403 by laser processing or photo lithography, and conductors may be formed so as to fill the openings or the peripheries of the openings.

Then, the signal interconnections 302a of the second signal interconnection layer 302 are connected to the bonding pads 304b of the second conductive layer 304 through the signal interconnections 301a of the first signal interconnection layer 301.

As described above, the circuit board 62 is manufactured through a repetition of heating and cooling in the manufacturing process.

In the first exemplary embodiment, glass epoxy substrate is used for the circuit board 62; however, a composite substrate or a paper phenolic substrate may be used. A copper-clad laminate using glass epoxy substrate may be used for the circuit board 62.

In the following, it is explained that deformation of the circuit board 62 caused by a repetition of heating and cooling on the occasion of manufacture and operations is suppressed, in the first exemplary embodiment.

Figure 10:
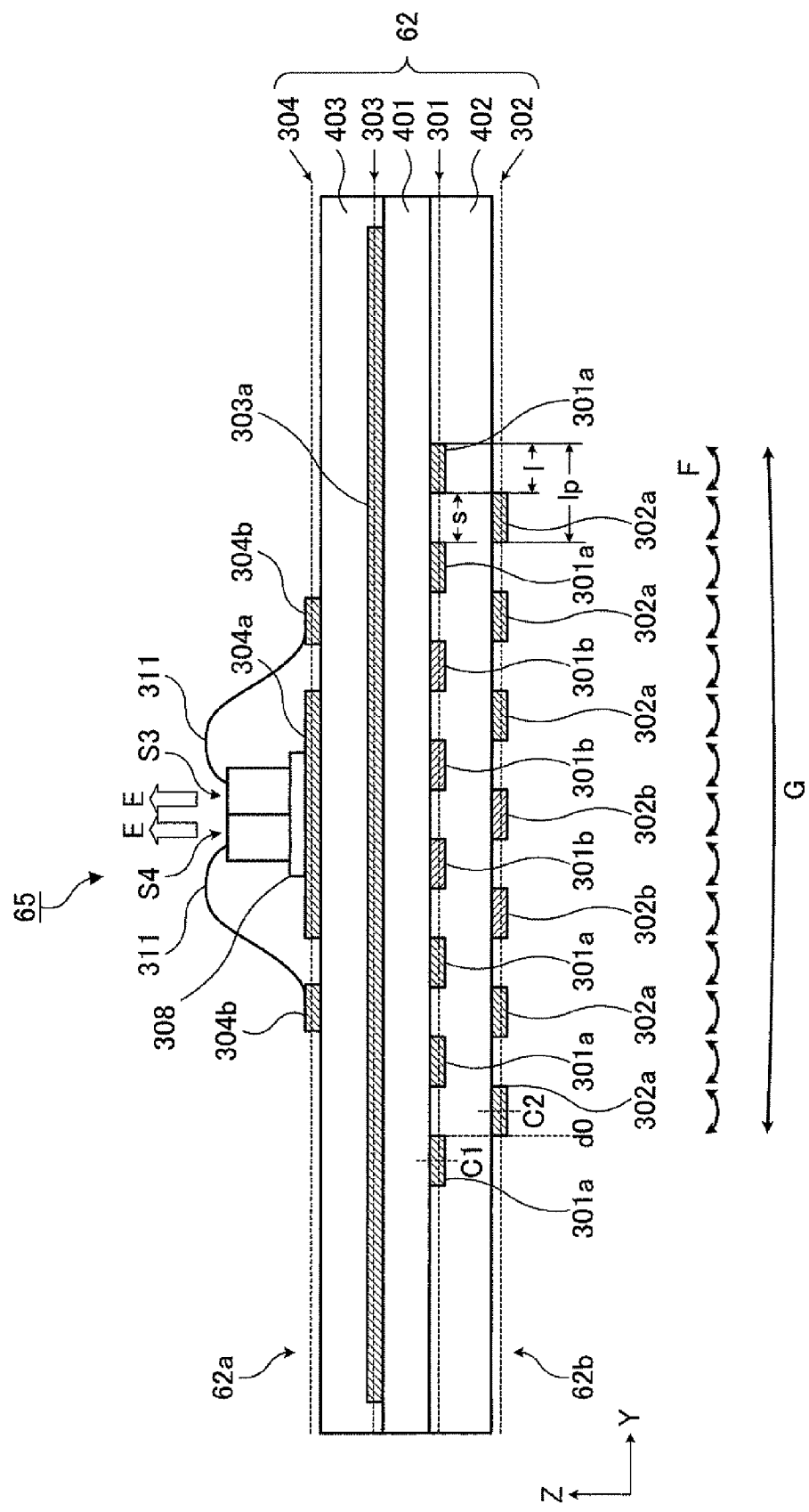
FIG. 10 is a diagram illustrating that deformation of the circuit board caused by a repetition of heating and cooling on the occasion of manufacture and operations is suppressed, in the first exemplary embodiment.

FIG. 10 is a diagram illustrating that deformation of the circuit board 62 caused by a repetition of heating and cooling on the occasion of manufacture and operations is suppressed, in the first exemplary embodiment.

Deformation of the circuit board 62 is caused by a difference in thermal expansion coefficients and contraction properties after heating between the electrical insulating material composing the first insulating layer 401, the second insulating layer 402 and the third insulating layer 403 and the conductive material of the first signal interconnection layer 301, the second signal interconnection layer 302, the first conductive layer 303 and the second conductive layer 304. That is, a conductive material has a larger thermal expansion coefficient than an insulating material. An insulating material and a conductive material do not return to the original state even if these materials are cooled after heating.

As shown in FIG. 10, the first signal interconnection layer 301 is provided with the signal interconnections 301a and the pseudo interconnections 301b, while the second signal interconnection layer 302 is provided with the signal interconnections 302a and the pseudo interconnections 302b.

Thus, when heated on the occasion of manufacture of the circuit board 62 and operations of the light-emitting device 65, the signal interconnections 301a and 302b and the pseudo interconnections 301b and 302b composed of a conductive material extend in the Y direction. However, since the insulating material composing the first insulating layer 401 and the second insulating layer 402 has a smaller thermal expansion coefficient than a conductive material, these layers do not extend along with the extension of the signal interconnections 301a and 302b and the pseudo interconnections 301b and 302b. Thus, portions of the signal interconnections 301a and 302b and the pseudo interconnections 301b and 302b in the circuit board 62 deform so as to expand to the side of the circuit board 62 on which the first signal interconnection layer 301 and the second signal interconnection layer 302 are provided (on the lower side in the figure), as indicated with arrows F.

The deformation indicated with the arrows F does not recover even after cooling and contracting. For this reason, the circuit board 62 deforms as indicated with an arrow G, based on the deformation of those portions indicated with the arrows F which are provided with the signal interconnections 301a and 302b and the pseudo interconnections 301b and 302b. The arrow G is an envelope curve connecting the deformation of the arrows F.

However, in the first exemplary embodiment, since the center positions C1 of the signal interconnections 301a and the pseudo interconnections 301b of the first signal interconnection layer 301 and the center positions C2 of the signal interconnections 302a and the pseudo interconnections 302b of the second signal interconnection layer 302 are displaced from each other, the deformation of the arrows F does not accumulate but disperses. Thus, the deformation of the arrow G is suppressed. This leads to suppression of slant of the light-emitting chips S arrayed on the circuit board 62, and then suppression of deviation of the direction E of light emission from the light-emitting chips S.

Figure 11:
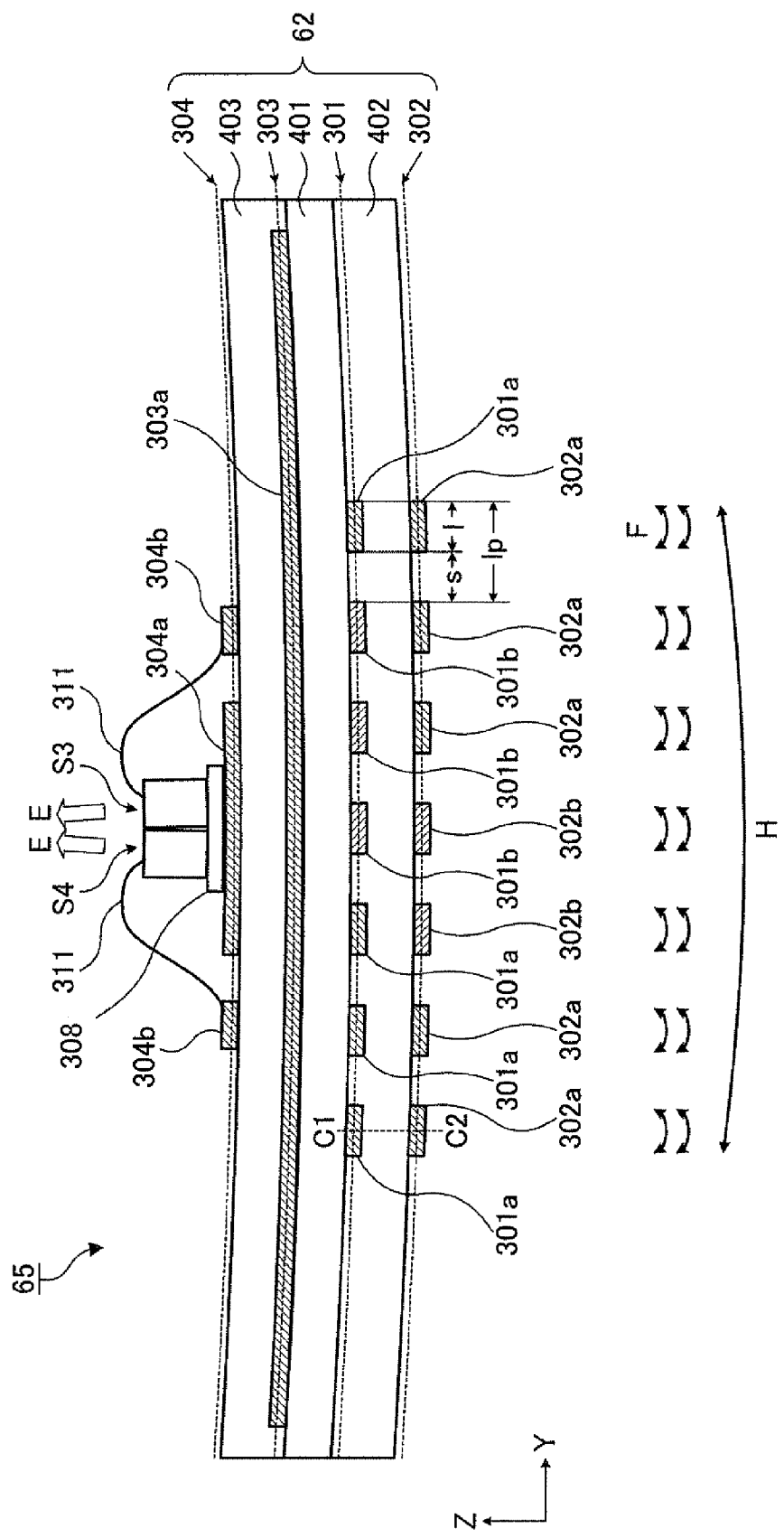
FIG. 11 is a diagram illustrating deformation of the circuit board caused by a repetition of heating and cooling on the occasion of manufacture and operations, in a case where the first exemplary embodiment is not applied.

FIG. 11 is a diagram illustrating deformation of the circuit board 62 caused by a repetition of heating and cooling on the occasion of manufacture and operations, in a case where the first exemplary embodiment is not applied.

As shown in FIG. 11, in the case where the first exemplary embodiment is not applied, the center positions C1 of the signal interconnections 301a and the pseudo interconnections 301b of the first signal interconnection layer 301 and the center positions C2 of the signal interconnections 302a and the pseudo interconnections 302b of the second signal interconnection layer 302 overlap in the Y direction, which is the lateral direction of the circuit board 62.

Thus, deformation of an arrow H due to the accumulated deformation of the arrows F becomes larger than the deformation of the arrow G in the case where the first exemplary embodiment is applied. This leads to slant of the light-emitting chips S, and then deviation of the direction E of light emission from the light-emitting chips S.

As described with reference to FIG. 10, in the first exemplary embodiment, the center positions C1 of the signal interconnections 301a and the pseudo interconnections 301b of the first signal interconnection layer 301 and the center positions C2 of the signal interconnections 302a and the pseudo interconnections 302b of the second signal interconnection layer 302 are displaced from each other, and thus accumulation of the deformation F of the circuit board 62 is suppressed. The amount of the displacement between the center positions C1 and the center positions C2 may be set to a half of the interconnection pitch 1p, as shown in FIG. 10. However, the amount of the displacement between the center positions C1 and the center positions C2 may not be set to a half of the interconnection pitch 1p, as long as the deformation G of the circuit board 62 is suppressed.

Additionally, in the first exemplary embodiment, the pseudo interconnections 301b and 302b are provided so that the density of the interconnections is uniform. With this configuration, the deformation F may be uniformly generated in the circuit board 62. Thus, the circuit board 62 may be provided with the pseudo interconnections 301b and 302b. However, the pseudo interconnections 301b and 302b may not be provided as long as the deformation G of the circuit board 62 is suppressed.

Additionally, the interconnection pitch 1p is fixed herein, but may be variable. As the interconnection width 1 becomes smaller, the deformation F may be reduced. However, the interconnection width 1 and the space width s may be set in accordance with easiness of manufacturing and yield in the manufacture, and may not be the above values.

Furthermore, the center positions C1 of the signal interconnections 301a and the pseudo interconnections 301b of the first signal interconnection layer 301 and the center positions C2 of the signal interconnections 302a and the pseudo interconnections 302b of the second signal interconnection layer 302 may not be displaced from each other for all of the signal interconnections and the pseudo interconnections. The displacement only needs to be enough to suppress the slant of the light-emitting chips S and the deviation of the optical axis thereof. Thus, the center positions C1 of the signal interconnections 301a and the pseudo interconnections 301b of the first signal interconnection layer 301 and the center positions C2 of the signal interconnections 302a and the pseudo interconnections 302b of the second signal interconnection layer 302 may be displaced from each other in a portion of the circuit board 62 on which the light-emitting chips S are mounted.

In FIGS. 5 and 10, signal interconnection layers including two layers of the first signal interconnection layer 301 and the second signal interconnection layer 302 are shown; however, the signal interconnection layers may include three layers or more.

Figure 12:
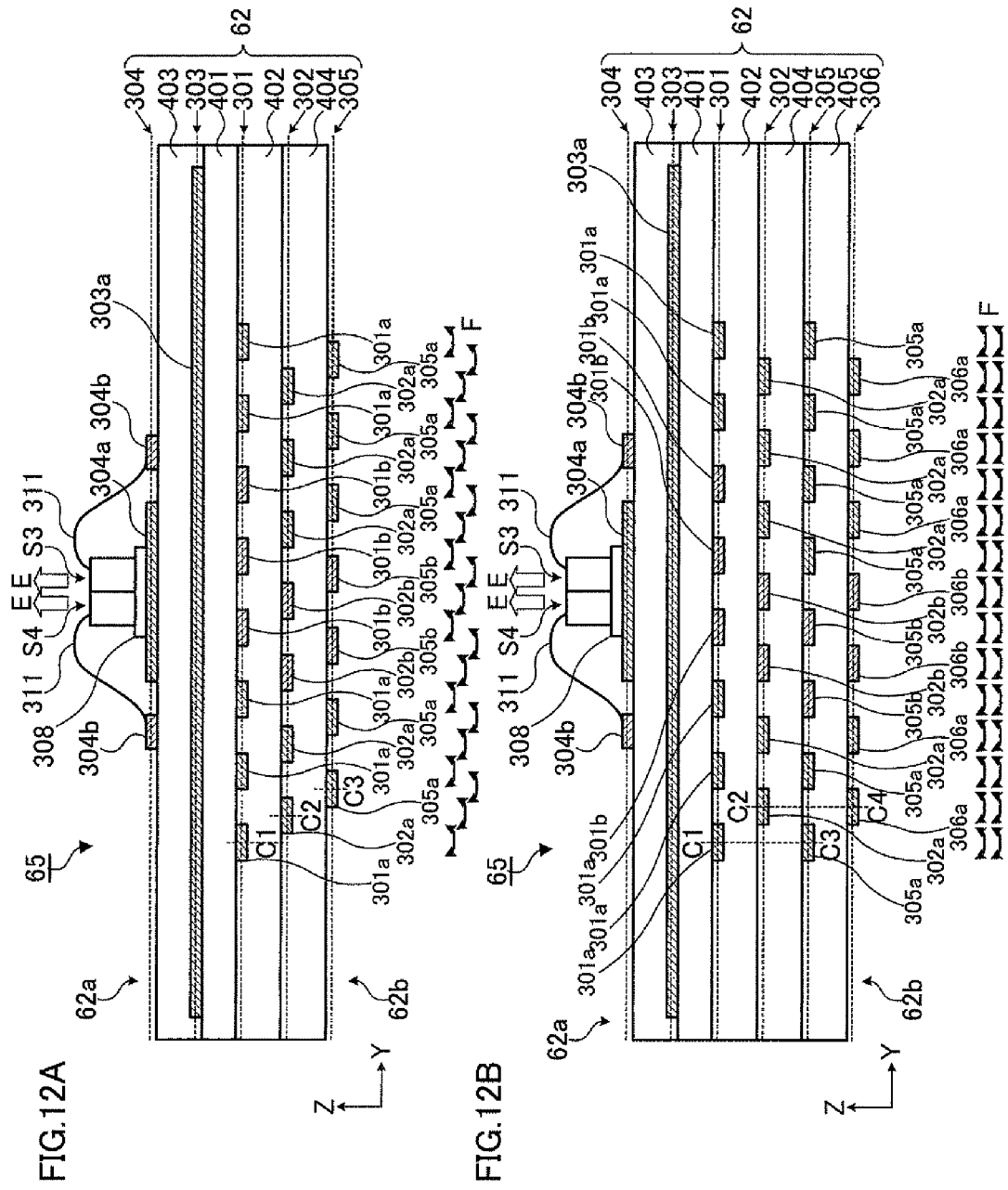
FIGS. 12A and 12B are diagrams showing examples of the light-emitting device where the signal interconnection layers include three or four layers.

FIGS. 12A and 12B are diagrams showing examples of the light-emitting device 65 where the signal interconnection layers include three or four layers. FIG. 12A shows an example of the light-emitting device 65 where the signal interconnection layers include three layers, while FIG. 12B shows an example of the light-emitting device 65 where the signal interconnection layers include four layers.

In the case shown in FIG. 12A where the signal interconnection layers include three layers, a fourth insulating layer 404 is provided to be in contact with the second signal interconnection layer 302 on the lower side of the second signal interconnection layer 302 (referring to the lower side in FIG. 12A), and further a third signal interconnection layer 305 is provided to be in contact with the fourth insulating layer 404 on the lower side of the fourth insulating layer 404. The third signal interconnection layer 305 includes signal interconnections 305a and pseudo interconnections 305b.

Center positions C3 of the signal interconnections 305a and the pseudo interconnections 305b of the third signal interconnection layer 305 are displaced from both of the center positions C1 of the signal interconnections 301a and the pseudo interconnections 301b of the first signal interconnection layer 301 and the center positions C2 of the signal interconnections 302a and the pseudo interconnections 302b of the second signal interconnection layer 302.

This configuration suppresses deformation of the circuit board 62 caused by a repetition of heating and cooling on the occasion of manufacture and operations, and thereby suppresses slant of the light-emitting chips S and then deviation of the direction E of light emission from the light-emitting chips S.

Note that the configuration may be such that in adjacent signal interconnection layers, namely, in the first signal interconnection layer 301 and the second signal interconnection layer 302, the center positions C1 of the signal interconnections 301a and the pseudo interconnections 301b and the center positions C2 of the signal interconnections 302a and the pseudo interconnections 302b, or in the second signal interconnection layer 302 and the third signal interconnection layer 305, the center positions C2 of the signal interconnections 302a and the pseudo interconnections 302b and the center positions C3 of the signal interconnections 305a and the pseudo interconnections 305b are displaced from each other, and that the center positions C1 of the signal interconnections 301a and the pseudo interconnections 301b of the first signal interconnection layer 301 and the center positions C3 of the signal interconnections 305a and the pseudo interconnections 305b of the third signal interconnection layer 305 overlap each other. That is, these layers may be provided so as not to accumulate the deformation F.

In the case shown in FIG. 12B where the signal interconnection layers include four layers, a fifth insulating layer 405 is further provided to be in contact with the third signal interconnection layer 305 of the signal interconnection layers including three layers shown in FIG. 12A, on the lower side of the third signal interconnection layer 305 (referring to the lower side in FIG. 12B), and further a fourth signal interconnection layer 306 is provided to be in contact with the fifth insulating layer 405 on the lower side of the fifth insulating layer 405. The fourth signal interconnection layer 306 includes signal interconnections 306a and pseudo interconnections 306b.

The center positions C3 of the signal interconnections 305a and the pseudo interconnections 305b of the third signal interconnection layer 305 are provided at the center positions C1 of the signal interconnections 301a and the pseudo interconnections 301b of the first signal interconnection layer 301, while center positions C4 of the signal interconnections 306a and the pseudo interconnections 306b of the fourth signal interconnection layer 306 are provided at the center positions C2 of the signal interconnections 302a and the pseudo interconnections 302b of the second signal interconnection layer 302.

This configuration suppresses deformation of the circuit board 62 caused by a repetition of heating and cooling on the occasion of manufacture and operations, and thereby suppresses deviation of the direction E of light emission from the light-emitting chips S of the light-emitting device 65, namely, deviation of the optical axis thereof.

In the print head 14 using the above-described light-emitting device 65, deviation of the optical axis of the light-emitting chips S in the light-emitting device 65 is suppressed, and thus loss of light and variation of intensity thereof in the rod lens array 64 is suppressed. Accordingly, the image forming apparatus 1 using the print head 14 is capable of forming an image with less degradation of image quality.

<Second Exemplary Embodiment>

In the second exemplary embodiment, the configuration of the first signal interconnection layer 301 and the second signal interconnection layer 302 in the circuit board 62 of the light-emitting device 65 is different from that in the first exemplary embodiment. In the first exemplary embodiment, the pseudo interconnections 301b and 302b are respectively provided in those portions of the first signal interconnection layer 301 and the second signal interconnection layer 302 which are located on the backside of the light-emitting chips S of the circuit board 62. In the second exemplary embodiment, the pseudo interconnections 301b and 302b are respectively provided in the first signal interconnection layer 301 and the second signal interconnection layer 302 in the whole surface of the circuit board 62.

Figure 13:
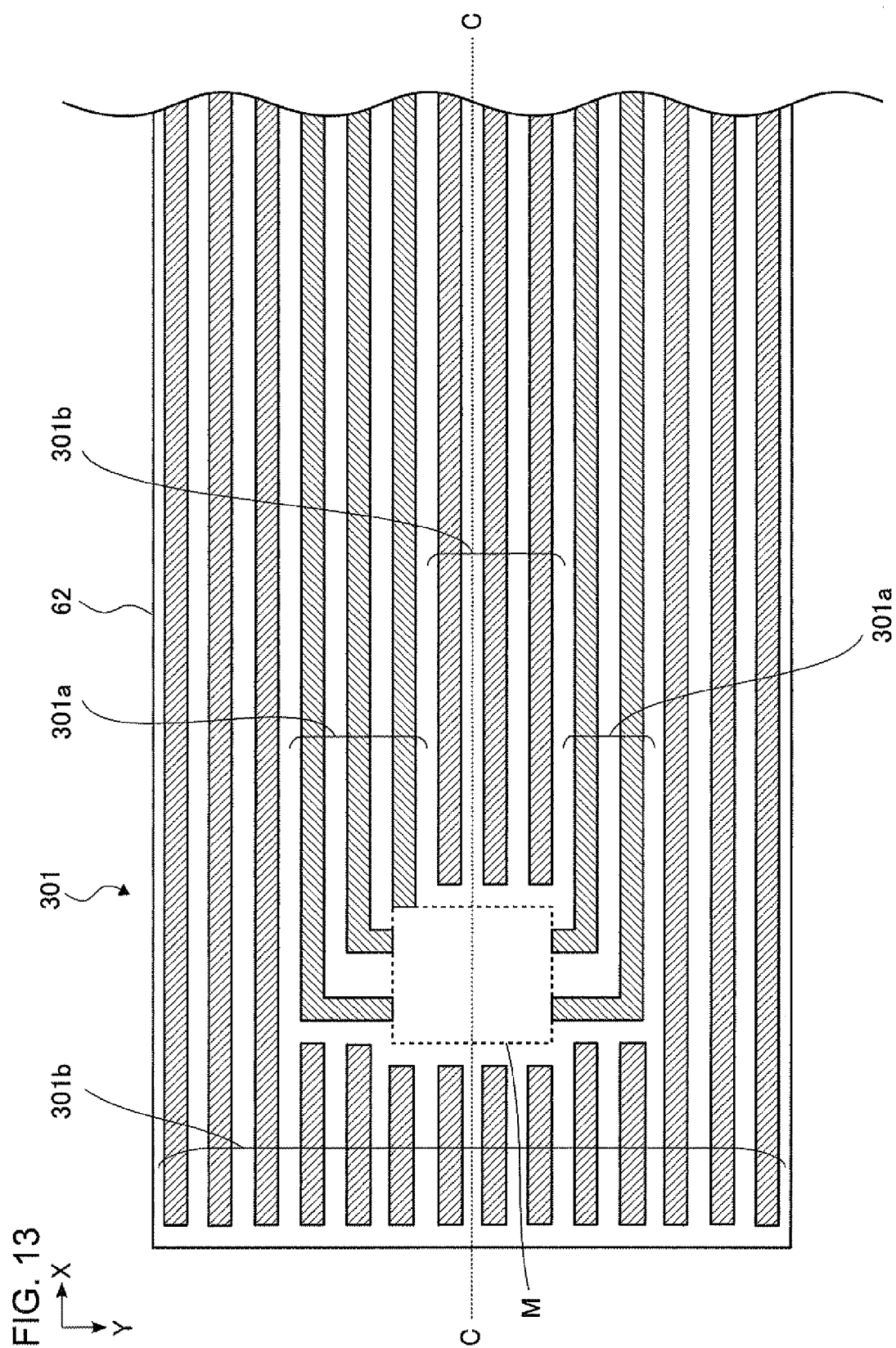
FIG. 13 is a plan view illustrating the first signal interconnection layer to which the second exemplary embodiment is applied.

FIG. 13 is a plan view illustrating the first signal interconnection layer 301 to which the second exemplary embodiment is applied. More pseudo interconnections 301b are provided so as to surround the signal interconnections 301a and the pseudo interconnections 301b of the first signal interconnection layer 301 in the first exemplary embodiment shown in FIG. 6. The pseudo interconnections 301b are provided in the X direction, which is the longitudinal direction of the circuit board 62.

Figure 14:
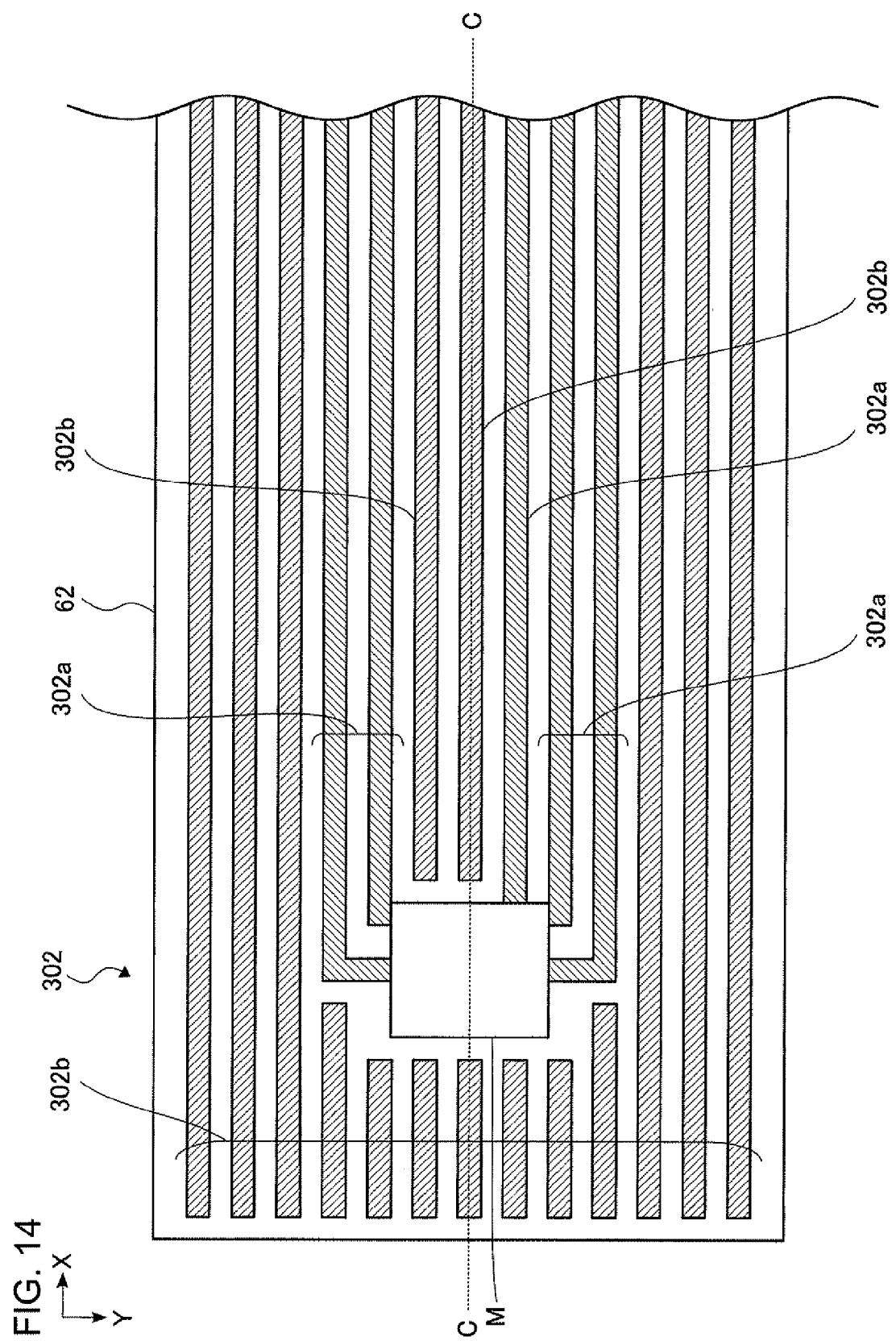
FIG. 14 is a plan view illustrating the second signal interconnection layer to which the second exemplary embodiment is applied.

FIG. 14 is a plan view illustrating the second signal interconnection layer 302 to which the second exemplary embodiment is applied. More pseudo interconnections 302b are provided so as to surround the signal interconnections 302a and the pseudo interconnections 302b of the second signal interconnection layer 302 in the first exemplary embodiment shown in FIG. 7. The pseudo interconnections 302b are provided in the X direction, which is the longitudinal direction of the circuit board 62.

This circuit board 62 may be manufactured by the manufacturing method described in the first exemplary embodiment.

Also in the second exemplary embodiment, since the center positions C1 of the signal interconnections 301a and the pseudo interconnections 301b of the first signal interconnection layer 301 and the center positions C2 of the signal interconnections 302a and the pseudo interconnections 302b of the second signal interconnection layer 302 are displaced from each other (see FIG. 5), the deformation of the arrows F (see FIG. 10) does not accumulate but disperses in the whole surface of the circuit board 62. Thus, the deformation of the arrow G (see FIG. 10) is suppressed in the whole surface of the circuit board 62. This leads to suppression of deviation of the direction E of light emission (see FIG. 10) from the light-emitting chips S, namely, deviation of the optical axis thereof.

In the print head 14 using the above-described light-emitting device 65, deviation of the optical axis of the light-emitting chips S in the light-emitting device 65 is suppressed, and thus loss of light and variation of intensity thereof in the rod lens array 64 is suppressed. Accordingly, the image forming apparatus 1 using the print head 14 is capable of forming an image with less degradation of image quality.

<Third Exemplary Embodiment>

In the third exemplary embodiment, the configuration of the first signal interconnection layer 301 and the second signal interconnection layer 302 in the circuit board 62 of the light-emitting device 65 is different from that in the first exemplary embodiment. In the first exemplary embodiment, both of the ratio of the interconnection (line) width 1 and the space width s of the signal interconnections 301a and the pseudo interconnections 301b in the first signal interconnection layer 301 of the circuit board 62, and the ratio of the interconnection (line) width 1 and the space width s of the signal interconnections 302a and the pseudo interconnections 302b in the second signal interconnection layer 302 of the circuit board 62 are 1 (1:1).

Figure 15:
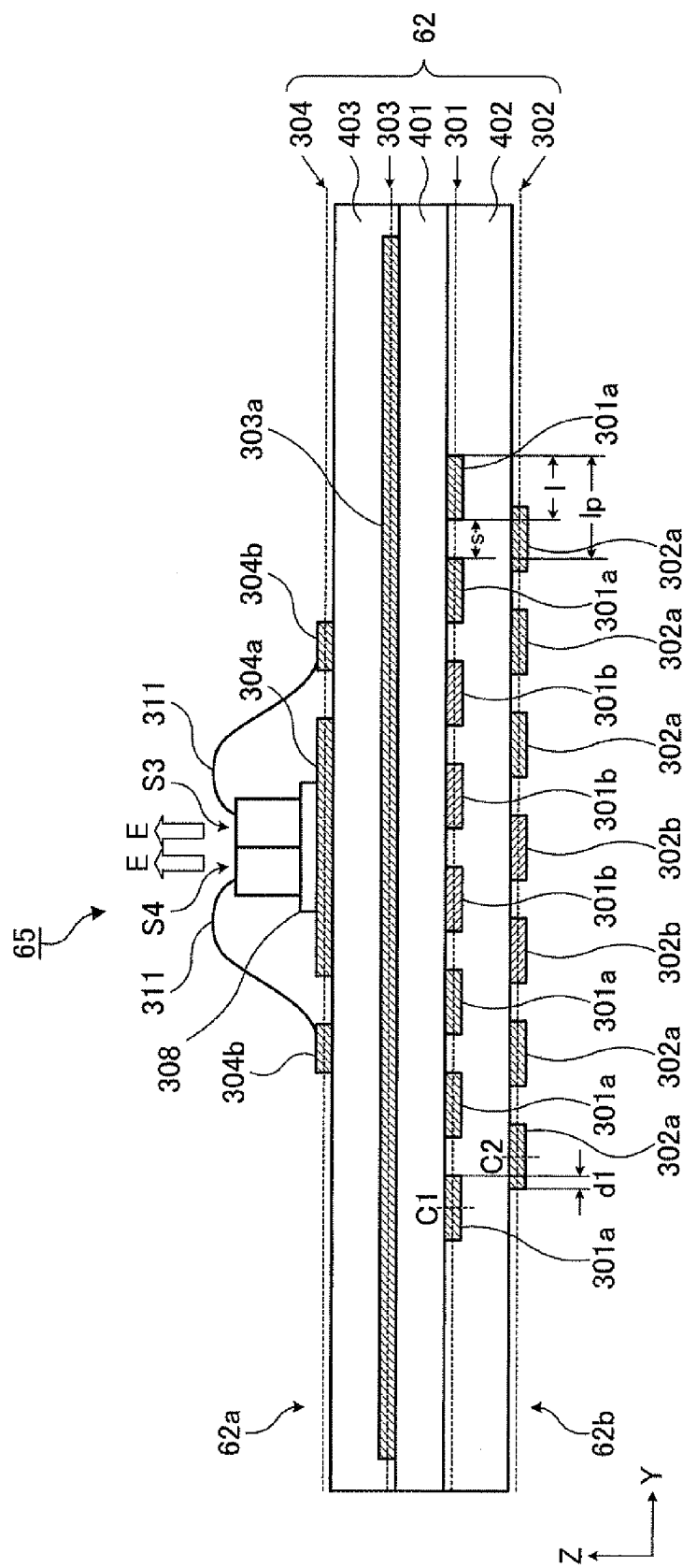
FIG. 15 is a diagram for illustrating a cross-sectional structure of the light-emitting device to which the third exemplary embodiment is applied.

FIG. 15 is a diagram for illustrating a cross-sectional structure of the light-emitting device 65 to which the third exemplary embodiment is applied.

In the third exemplary embodiment, the ratio of the interconnection width 1 and the space width s is larger than 1 (interconnection width 1>space width s). For example, the interconnection pitch 1p, the interconnection width 1 and the space width s are set to 200 µm, 125 µm and 75 µm, respectively.

The center positions C1 in the Y direction of the signal interconnections 301a and the pseudo interconnections 301b of the first signal interconnection layer 301 and the center positions C2 in the Y direction of the signal interconnections 302a and the pseudo interconnections 302b of the second signal interconnection layer 302 are displaced from each other.

In this case, even if the displacement between the center positions C1 and the center positions C2 is a half of the interconnection pitch 1p, the signal interconnections 301a or the pseudo interconnections 301b in the first signal interconnection layer 301 overlap the signal interconnections 302a or the pseudo interconnections 302b in the second signal interconnection layer 302 at edges thereof with a distance (width) d1.

Note that the distance (width) d1 of the overlap between the signal interconnections 301a or the pseudo interconnections 301b in the first signal interconnection layer 301 and the signal interconnections 302a or the pseudo interconnections 302b in the second signal interconnection layer 302 may not be 25 μm mentioned above.

This circuit board 62 may be manufactured by the manufacturing method described in the first exemplary embodiment.

Also in the third exemplary embodiment, since the center positions C1 of the signal interconnections 301a and the pseudo interconnections 301b of the first signal interconnection layer 301 and the center positions C2 of the signal interconnections 302a and the pseudo interconnections 302b of the second signal interconnection layer 302 are displaced from each other, the deformation of the arrows F (see FIG. 10) does not accumulate but disperses in the circuit board 62. Thus, the deformation of the circuit board 62 is suppressed. This leads to suppression of deviation of the direction E of light emission from the light-emitting chips S, namely, deviation of the optical axis thereof.

In the print head 14 using the above-described light-emitting device 65, deviation of the optical axis of the light-emitting chips S in the light-emitting device 65 is suppressed, and thus loss of light and variation of intensity thereof in the rod lens array 64 is suppressed. Accordingly, the image forming apparatus 1 using the print head 14 is capable of forming an image with less degradation of image quality.

In the third exemplary embodiment, the pseudo interconnections 301b and 302b may be provided in the whole surface of the circuit board 62, as shown in the second exemplary embodiment.

Additionally, the signal interconnection layers may include three or more layers.

<Fourth Exemplary Embodiment>

In the fourth exemplary embodiment, the configuration of the first signal interconnection layer 301 and the second signal interconnection layer 302 in the circuit board 62 of the light-emitting device 65 is different from that in the first exemplary embodiment. In the first exemplary embodiment, both of the ratio of the interconnection (line) width 1 and the space width s of the signal interconnections 301a and the pseudo interconnections 301b in the first signal interconnection layer 301 of the circuit board 62, and the ratio of the interconnection width 1 and the space width s of the signal interconnections 302a and the pseudo interconnections 302b in the second signal interconnection layer 302 of the circuit board 62 are 1 (1:1).

Figure 16:
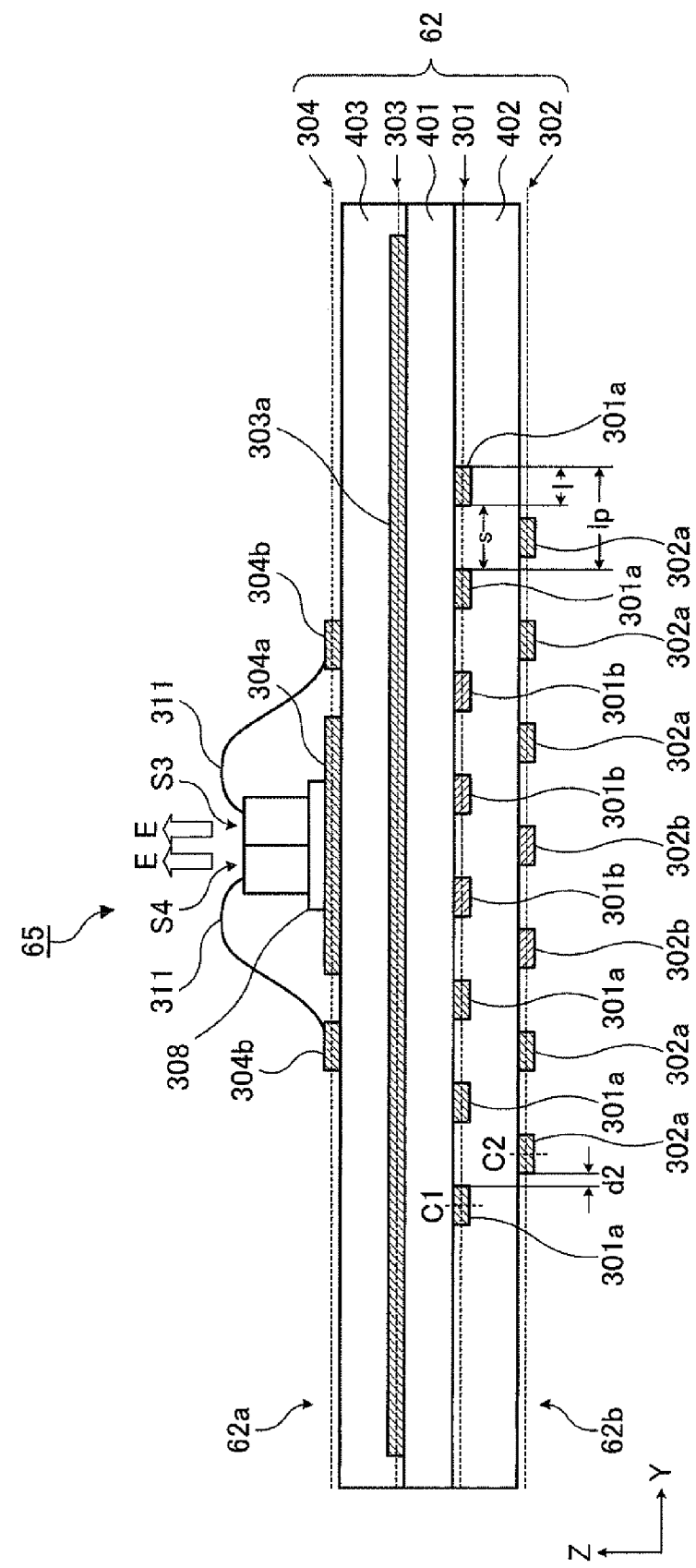
FIG. 16 is a diagram for illustrating a cross-sectional structure of the light-emitting device to which the fourth exemplary embodiment is applied.

FIG. 16 is a diagram for illustrating a cross-sectional structure of the light-emitting device 65 to which the fourth exemplary embodiment is applied.

In the fourth exemplary embodiment, the ratio of the interconnection width 1 and the space width s is smaller than 1 (interconnection width 1<space width s). For example, the interconnection pitch 1p, the interconnection width 1 and the space width s are set to 200 μm, 75 μm and 125 μm, respectively.

The center positions C1 of the signal interconnections 301a and the pseudo interconnections 301b of the first signal interconnection layer 301 and the center positions C2 of the signal interconnections 302a and the pseudo interconnections 302b of the second signal interconnection layer 302 are displaced from each other.

In this case, even if the displacement between the center positions C1 and the center positions C2 is a half of the interconnection pitch 1p, the signal interconnections 301a or the pseudo interconnections 301b in the first signal interconnection layer 301 are separated from the signal interconnections 302a or the pseudo interconnections 302b in the second signal interconnection layer 302 at edges thereof in the Y direction with a distance d2.

Note that the distance d2 between the signal interconnections 301a or the pseudo interconnections 301b in the first signal interconnection layer 301 and the signal interconnections 302a or the pseudo interconnections 302b in the second signal interconnection layer 302 may not be 25 μm mentioned above.

This circuit board 62 may be manufactured by the manufacturing method described in the first exemplary embodiment.

Also in the fourth exemplary embodiment, since the center positions C1 of the signal interconnections 301a and the pseudo interconnections 301b of the first signal interconnection layer 301 and the center positions C2 of the signal interconnections 302a and the pseudo interconnections 302b of the second signal interconnection layer 302 are displaced from each other, the deformation of the arrows F (see FIG. 10) does not accumulate but disperse in the circuit board 62. This suppresses deformation of the circuit board 62, and thereby suppresses slant of the direction E of light emission from the light-emitting chips S. Thus, the deformation of the arrow G (see FIG. 10) is suppressed in the circuit board 62. This leads to suppression of deviation of the direction E of light emission (see FIG. 10) from the light-emitting chips S, namely, deviation of the optical axis thereof.

In the print head 14 using the above-described light-emitting device 65, deviation of the optical axis of the light-emitting chips S in the light-emitting device 65 is suppressed, and thus loss of light and variation of intensity thereof in the rod lens array 64 is suppressed. Accordingly, the image forming apparatus 1 using the print head 14 is capable of forming an image with less degradation of image quality.

In the fourth exemplary embodiment, the pseudo interconnections 301b and 302b may be provided in the whole surface of the circuit board 62, as shown in the second exemplary embodiment.

Additionally, the signal interconnection layers may include three or more layers.

In the third and fourth exemplary embodiments, the interconnection width 1 and the space width s of the signal interconnections and the pseudo interconnections in the first signal interconnection layer 301 and the second signal interconnection layer 302 are set to be the same; however, these widths may have different values for each of the signal interconnection layers.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting device comprising:
a circuit board including at least two of signal interconnection layers each having a plurality of signal interconnections extending along a longitudinal direction of the circuit board, at least adjacent two of the signal interconnection layers including signal interconnections provided so that center positions of the respective signal interconnections in a direction intersecting with the longitudinal direction of the circuit board are displaced from each other in portions of the signal interconnections provided in the longitudinal direction of the circuit board; and
a plurality of light-emitting chips each having a plurality of light-emitting elements, the light-emitting chips being arrayed in line in the longitudinal direction of the circuit board on a surface of the circuit board.

2. The light-emitting device according to claim 1, wherein the circuit board includes the signal interconnections provided so that the center positions of the respective signal interconnections in the direction intersecting with the longitudinal direction of the circuit board are displaced from each other in the portions of the signal interconnections provided in the longitudinal direction of the circuit board in a portion where the plurality of light-emitting chips are arrayed.

3. The light-emitting device according to claim 2, wherein each of the at least two of signal interconnection layers in the circuit board further includes a plurality of pseudo interconnections.

4. The light-emitting device according to claim 3, wherein those portions of the plurality of signal interconnections and the plurality of pseudo interconnections in each of the at least two of signal interconnection layers which are provided in the longitudinal direction of the circuit board are provided at predetermined intervals.

5. The light-emitting device according to claim 1, wherein each of the at least two of signal interconnection layers in the circuit board further includes a plurality of pseudo interconnections.

6. The light-emitting device according to claim 5, wherein those portions of the plurality of signal interconnections and the plurality of pseudo interconnections in each of the at least two of signal interconnection layers which are provided in the longitudinal direction of the circuit board are provided at predetermined intervals.

7. A print head comprising:
an exposure unit exposing an image carrier; and
an optical unit causing light emitted from the exposure unit to form an image on the image carrier,
the exposure unit including:
a circuit board including at least two of signal interconnection layers each having a plurality of signal interconnections extending along a longitudinal direction of the circuit board, at least adjacent two of the signal interconnection layers including signal interconnections provided so that center positions of the respective signal interconnections in a direction intersecting with the longitudinal direction of the circuit board are displaced from each other in portions of the signal interconnections provided in the longitudinal direction of the circuit board; and
a plurality of light-emitting chips each having a plurality of light-emitting elements, the light-emitting chips being arrayed in line in the longitudinal direction of the circuit board on a surface of the circuit board.

8. An image forming apparatus comprising:
a charging unit charging an image carrier;
an exposure unit exposing the image carrier;
an optical unit causing light emitted from the exposure unit to form an image on the image carrier;
a developing unit developing an electrostatic latent image formed on the image carrier; and
a transfer unit transferring an image developed on the image carrier to a transferred body, the exposure unit including:
a circuit board including at least two of signal interconnection layers each having a plurality of signal interconnections extending along a longitudinal direction of the circuit board, at least adjacent two of the signal interconnection layers including signal interconnections provided so that center positions of the respective signal interconnections in a direction intersecting with the longitudinal direction of the circuit board are displaced from each other in portions of the signal interconnections provided in the longitudinal direction of the circuit board; and
a plurality of light-emitting chips each having a plurality of light-emitting elements, the light-emitting chips being arrayed in line in the longitudinal direction of the circuit board on a surface of the circuit board.

* * * * *